US012652820B2

(12) United States Patent
Yu et al.

(10) Patent No.: US 12,652,820 B2
(45) Date of Patent: Jun. 9, 2026

(54) BACKSIDE CONTACT

(71) Applicant: Taiwan Semiconductor Manufacturing Co., Ltd., Hsinchu (TW)

(72) Inventors: Li-Zhen Yu, Hsinchu (TW); Huan-Chieh Su, Changhua County (TW); Lin-Yu Huang, Hsinchu (TW); Kuan-Lun Cheng, Hsin-Chu (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 987 days.

(21) Appl. No.: 17/874,525

(22) Filed: Jul. 27, 2022

(65) Prior Publication Data

US 2022/0367705 A1 Nov. 17, 2022

Related U.S. Application Data

(62) Division of application No. 17/112,293, filed on Dec. 4, 2020, now Pat. No. 11,588,050.

(Continued)

(51) Int. Cl.
*H10D 30/62* (2025.01)
*H10D 30/01* (2025.01)
(Continued)

(52) U.S. Cl.
CPC ........... *H10D 30/62* (2025.01); *H10D 30/024* (2025.01); *H10D 30/0291* (2025.01); *H10D 62/151* (2025.01); *H10P 14/3411* (2026.01)

(58) Field of Classification Search
CPC .......................... H10D 30/62; H10D 84/0149
See application file for complete search history.

(56) References Cited

U.S. PATENT DOCUMENTS

| | | | |
|---|---|---|---|
| 7,825,472 B2 | 11/2010 | Park | |
| 9,780,210 B1 | 10/2017 | Goktepeli | |

(Continued)

FOREIGN PATENT DOCUMENTS

| | | |
|---|---|---|
| DE | 112015006959 | 6/2018 |
| KR | 20190015269 | 2/2019 |

(Continued)

OTHER PUBLICATIONS

Liao, Yi-Bo, et al., "Source/Drain Contact Structure", U.S. Appl. No. 17/093,230, filed Nov. 9, 2020, Assignee: Taiwan Semiconductor Manufacturing Co., Ltd., 50 pages specification, 57 pages drawings.

(Continued)

*Primary Examiner* — Ali Naraghi
(74) *Attorney, Agent, or Firm* — HAYNES AND BOONE, LLP

(57) ABSTRACT

A semiconductor structure and a method of forming the same are provided. In an embodiment, a semiconductor structure includes an epitaxial source feature and an epitaxial drain feature, a vertical stack of channel members disposed over a backside dielectric layer, the vertical stack of channel members extending between the epitaxial source feature and the epitaxial drain feature along a direction, a gate structure wrapping around each of the vertical stack of channel members, and a backside source contact disposed in the backside dielectric layer. The backside source contact includes a top portion adjacent the epitaxial source feature (Continued)

200

268
264
214
266
220
248
248
246
Z
X Y
212S and a bottom portion away from the epitaxial source feature. The top portion and the bottom portion includes a step width change along the direction.

20 Claims, 20 Drawing Sheets

Related U.S. Application Data

(60) Provisional application No. 63/072,476, filed on Aug. 31, 2020.

(51) Int. Cl.
     _H10D 62/13_      (2025.01)
     _H10P 14/20_      (2026.01)

(56) References Cited

U.S. PATENT DOCUMENTS

| | | | | |
|---|---|---|---|---|
| 10,797,139 | B2 | 10/2020 | Morrow et al. | |
| 10,886,217 | B2 * | 1/2021 | Morrow | G06F 30/394 |
| 11,081,559 | B1 * | 8/2021 | Liang | H10D 64/01 |
| 2007/0296002 | A1 | 12/2007 | Liang | |
| 2014/0264280 | A1 | 9/2014 | Kim | |
| 2016/0284821 | A1 | 9/2016 | Kim | |

| | | | | |
|---|---|---|---|---|
| 2018/0175034 | A1 * | 6/2018 | Goktepeli | H01L 21/76898 |
| 2020/0091348 | A1 | 3/2020 | Guhu et al. | |
| 2020/0294998 | A1 * | 9/2020 | Lilak | H01L 23/535 |
| 2020/0381525 | A1 * | 12/2020 | Morrow | H10D 84/0158 |

FOREIGN PATENT DOCUMENTS

| | | |
|---|---|---|
| KR | 20190036533 | 4/2019 |
| TW | 201817011 A | 5/2018 |
| WO | 2018004653 A1 | 1/2018 |
| WO | 2018031175 A1 | 2/2018 |

OTHER PUBLICATIONS

Lung-Kun Chu, et al., "Self-Aligned Backside Source Contact Structure", U.S. Appl. No. 17/016,109 filed Sep. 9, 2020, Assignee: Taiwan Semiconductor Manufacturing Co. Ltd., 31 pages specification, 17 pages drawings.

Huan-Chieh Su, et al., "Backside Power Rail and Methods of Forming the Same", U.S. Appl. No. 16/901,963, Assignee: Taiwan Semiconductor Manufacturing Co., Ltd., 29 pages specification, 22 pages drawings.

Pei-Wei Wang, et al., "Method of Forming Backside Power Rails", U.S. Appl. No. 17/037,274, Assignee: Taiwan Semiconductor Manufacturing Company, Ltd., 29 pages specification, 16 pages drawings.

* cited by examiner

BACKSIDE CONTACT

PRIORITY DATA

This application is a divisional application of U.S. patent application Ser. No. 17/112,293, filed Dec. 4, 2020, which claims priority to U.S. Provisional Patent Application No. 63/072,476, filed on Aug. 31, 2020, entitled "Backside Contact," each of which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As integrated circuit (IC) technologies progress towards smaller technology nodes, some routing structures have been moved from the front side of the device structures to the back side of the device structures. For example, backside power rails (BPR) or super power rails (SPR) have been proposed where a backside source/drain contact is formed through the substrate to come in contact with a source/drain feature and a power rail is formed on the backside of the substrate to be in contact with the backside source/drain contact. The formation of the backside source/drain contact is not without its challenges. When the photolithography mask overlay is less than perfect, the backside source contact may be shorted to the gate structure. Therefore, while convention backside source contact and its formation are generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-17A, 2B-17B, and 10C-17C illustrate fragmentary cross-sectional views of a workpiece during a fabrication process according to the method of FIG. 1, according to one or more aspects of the present disclosure.

DETAILED DESCRIPTION

Figure 1:
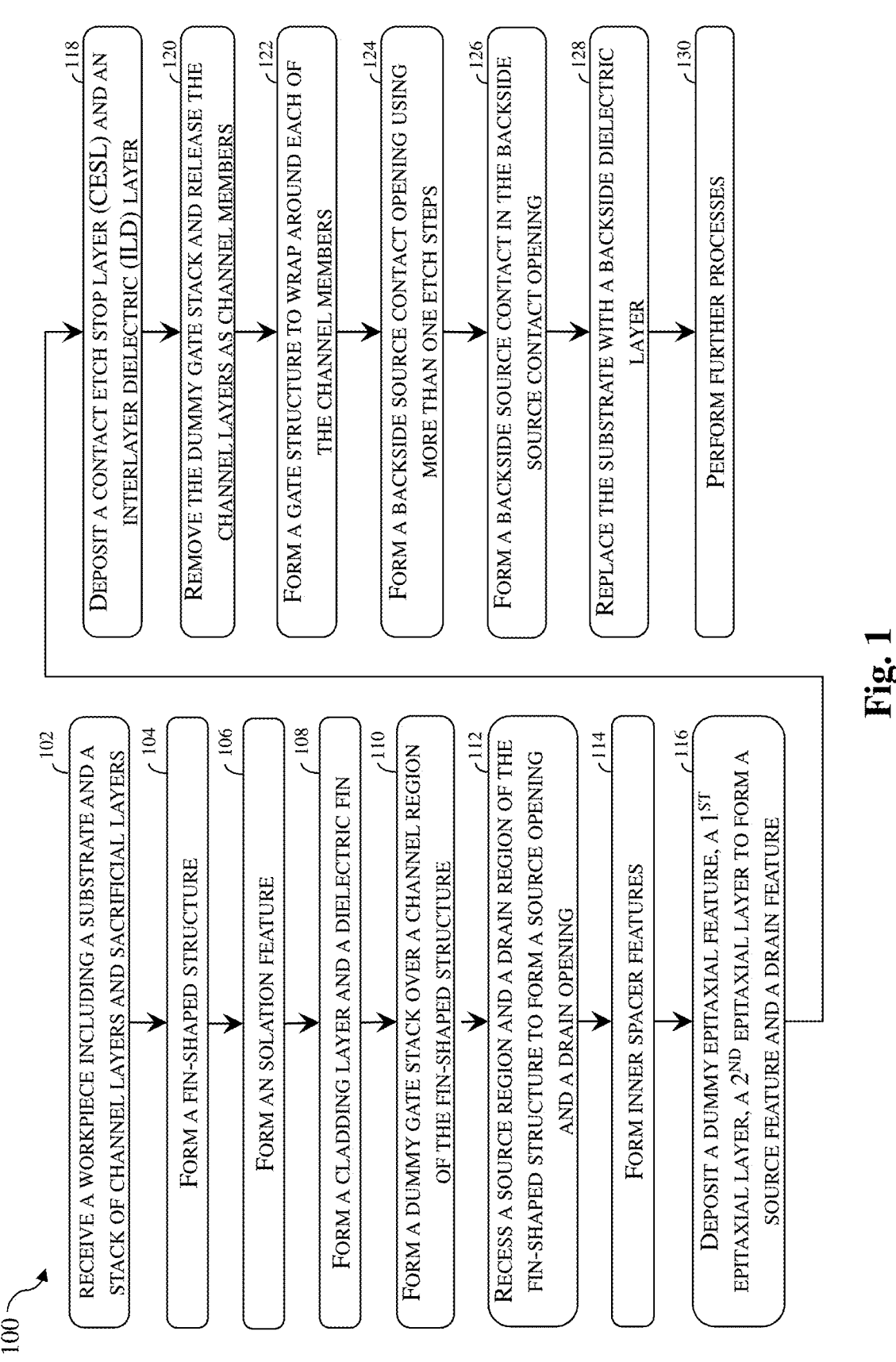
FIG. 1 illustrates a flow chart of a method for forming a semiconductor device having a backside contact, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to methods of forming a semiconductor device having a backside contact, and more particularly to methods of forming a backside contact opening using multiple etching steps.

Conventionally, source/drain contacts and gate contacts of transistors on a substrate connect source/drain features of the transistors to an interconnect structure over a front side of the substrate. As the dimensions of IC devices shrink, the close proximity among the source contacts and gate contacts may reduce process windows for forming these contacts and may increase parasitic capacitance among them. The backside power rail (BPR) structure is a modern solution for performance boost on power delivery network (PDN) for advanced technology node. Implementation of BPR structures may ease the crowding of contacts. In some conventional processes, the backside contact opening is formed using photolithography and an anisotropic dry etch. In these conventional processes, when the overlay is less than perfect, the anisotropic dry etch may damage an adjacent gate structure, causing electrical short between the gate structure and the backside contact.

The present disclosure provides processes for forming a backside contact that is self-aligned to a source/drain feature. Processes of the present disclosure form a dummy epitaxial feature in a source/drain opening that extends into the substrate. The dummy epitaxial feature is different from that of the substrate to provide etch selectivity. After the formation of the source/drain features and the gate structures, the substrate is flipped over. A backside contact opening is formed using a first etch process and a second etch process. In the first etch process, the substrate is etched using an anisotropic etch process through a patterned mask layer. The first etch process etches through the substrate but does not etch through the dummy epitaxial feature. The dummy epitaxial feature is then isotropically and selectively etched in the second etch process to expose the source/drain feature. Because the second etch process is selective to the dummy epitaxial feature relative to the substrate, the second etch process is self-aligned and is less likely to damage the gate structure. Processes of the present disclosure therefore may reduce gate-source/drain short and improve yield.

The various aspects of the present disclosure will now be described in more detail with reference to the figures. In that regard, FIG. 1 is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2A-16A, 2B-16B, and 10C-16C, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires. Throughout the present disclosure, like reference numerals denote like features, unless otherwise excepted.

Figures 2A, 2B:
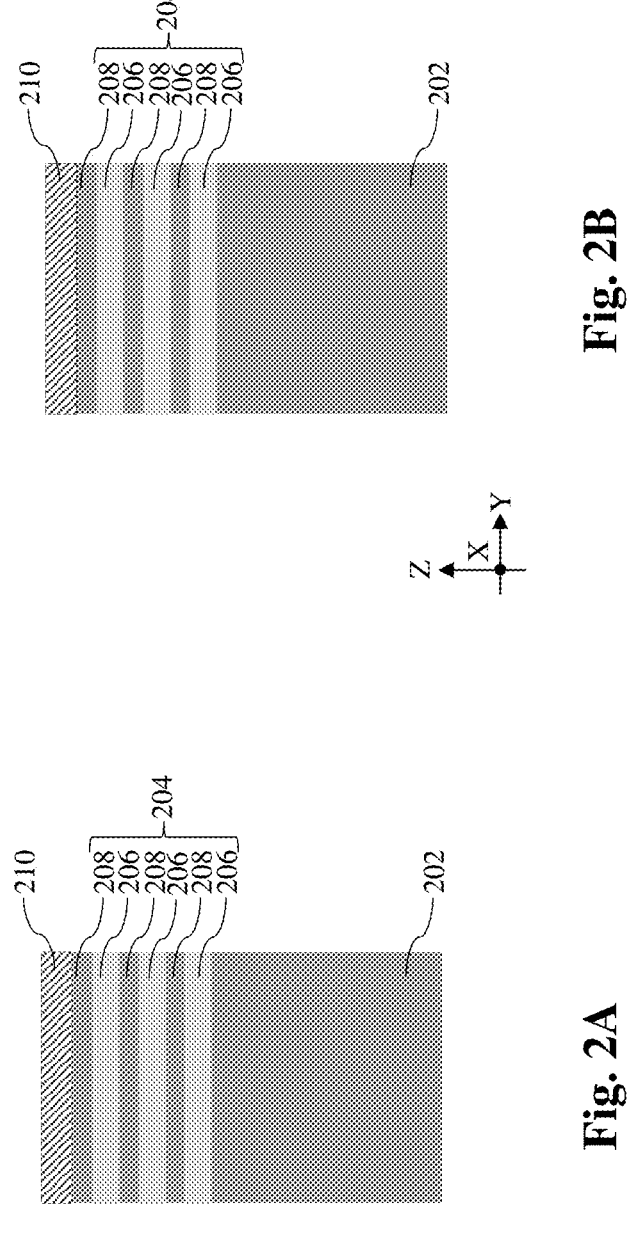

Referring to FIGS. 1, 2A and 2B, method 100 includes a block 102 where a workpiece 200 is received. As shown in FIGS. 2A and 2B, the workpiece 200 includes a substrate 202 and a stack 204 disposed on the substrate 202. In one embodiment, the substrate 202 may be a silicon (Si) substrate. In some other embodiments, the substrate 202 may include other semiconductor materials such as germanium (Ge), silicon germanium (SiGe), or a III-V semiconductor material. Example III-V semiconductor materials may include gallium arsenide (GaAs), indium phosphide (InP), gallium phosphide (GaP), gallium nitride (GaN), gallium arsenide phosphide (GaAsP), aluminum indium arsenide (AlInAs), aluminum gallium arsenide (AlGaAs), gallium indium phosphide (GaInP), and indium gallium arsenide (InGaAs). The stack 204 may include a plurality of channel layers 208 interleaved by a plurality of sacrificial layers 206. The channel layers 208 and the sacrificial layers 206 may have different semiconductor compositions. In some implementations, the channel layers 208 are formed of silicon (Si) and sacrificial layers 206 are formed of silicon germanium (SiGe). In these implementations, the additional germanium content in the sacrificial layers 206 allow selective removal or recess of the sacrificial layers 206 without substantial damages to the channel layers 208. In some embodiments, the sacrificial layers 206 and channel layers 208 may be deposited using an epitaxial process. The stack 204 may be epitaxially deposited using CVD deposition techniques (e.g., vapor-phase epitaxy (VPE) and/or ultra-high vacuum CVD (UHV-CVD)), molecular beam epitaxy (MBE), and/or other suitable processes. The sacrificial layers 206 and the channel layers 208 are deposited alternatingly, one-after-another, to form the stack 204. It is noted that three (3) layers of the sacrificial layers 206 and three (3) layers of the channel layers 208 are alternately and vertically arranged as illustrated in FIG. 2A, which is for illustrative purposes only and not intended to be limiting beyond what is specifically recited in the claims. The number of layers depends on the desired number of channels members for the semiconductor device 200. In some embodiments, the number of the channel layers 208 is between 2 and 10.

To prepare for the subsequent patterning process, a hard mask layer 210 is deposited over the stack 204. The hard mask layer 210 serves as an etch mask to pattern the stack 204 and even a portion of the substrate 202 to form a fin-shaped structure 212 (shown in FIG. 3B). In some embodiments, the hard mask layer 210 may be deposited using CVD, plasma-enhanced CVD (PECVD), atomic layer deposition (ALD), plasma-enhanced ALD (PEALD), or a suitable deposition method. The hard mask layer 210 may be a single layer or a multilayer. When the hard mask layer 210 is a multi-layer, it may include a first layer and a second layer disposed over the first layer. In one embodiment, the first layer may be a pad oxide and the second layer may be a pad nitride layer.

Figures 3A, 3B:
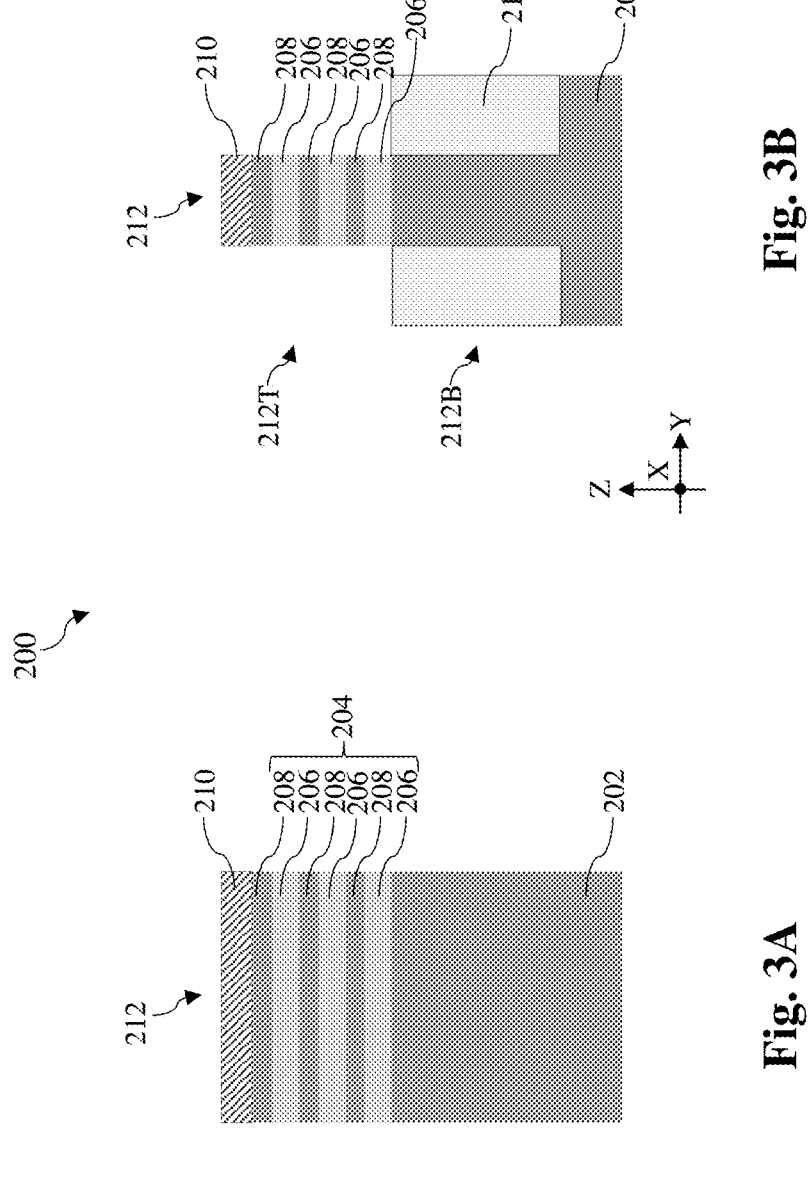

Referring to FIGS. 1, 3A and 3B, method 100 includes a block 104 where a fin-shaped structure 212 is formed. In some embodiments, at block 104, the stack 204 and a portion of the substrate 202 are patterned to form the fin-shaped structure 212. As shown in FIGS. 3A and 3B, each of the fin-shaped structures 212 includes a base portion 212B formed from a portion of the substrate 202 and a top portion 212T formed from the stack 204. The top portion 212T is disposed over the base portion 212B. The fin-shaped structures 212 extend lengthwise along the X direction and extend vertically along the Z direction from the substrate 202. The fin-shaped structures 212 may be patterned using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a material layer is formed over a substrate and patterned using a photolithography process. Spacers are formed alongside the patterned material layer using a self-aligned process. The material layer is then removed, and the remaining spacers, or mandrels, may then be used to pattern the hard mask layer 210 and then the patterned hard mask layer 210 may be used to pattern the fin-shaped structures 212 by etching the stack 204 and the substrate 202. The etching process can include dry etching, wet etching, reactive ion etching (RIE), and/or other suitable processes. While not explicitly shown in the figures, a semiconductor liner may be formed over the fin-shaped structure 212. The semiconductor liner may include silicon (Si) or silicon-rich silicon germanium (SiGe). In some implementations, the semiconductor liner may be deposited using ALD, PEALD, VPE, MBE, or a suitable method.

Referring to FIGS. 1, 3A and 3B, method 100 includes a block 106 where an isolation feature 214 is formed. After the fin-shaped structures 212 are formed, the isolation feature 214 shown in FIG. 3B is formed between neighboring fin-shaped structures 212. The isolation feature 214 may also be referred to as a shallow trench isolation (STI) feature 214. In an example process, a dielectric material for the isolation feature 214 is first deposited over the fin-shaped structure 212, filling the trenches between fin-shaped structures 212 with the dielectric material. In some embodiments, the dielectric material may include silicon oxide, silicon nitride, silicon oxynitride, fluorine-doped silicate glass (FSG), a low-k dielectric, combinations thereof, and/or other suitable materials. In various examples, the dielectric material may be deposited by a CVD process, a subatmospheric CVD (SACVD) process, a flowable CVD (FCVD) process, an ALD process, spin-on coating, and/or other suitable process. The deposited dielectric material is then thinned and planarized, for example by a chemical mechanical polishing (CMP) process. The planarized dielectric material is further recessed or etched back by a dry etching process, a wet etching process, and/or a combination thereof to form the isolation feature 214. As shown in FIG. 3B, the top portions 212T of the fin-shaped structures 212 rise above the isolation feature 214 while the base portions 212B are surrounded by the isolation feature 214. It is noted that because the cross section in FIG. 3A cut through the fin-shaped structure 212, the isolation feature 214 is not shown in FIG. 3A.

Referring to FIGS. 1, 4A, 4B, 5A, and 5B, method 100 includes a block 108 where a cladding layer 216 and a dielectric fin 220 are formed. In some embodiments, the cladding layer 216 may have a composition similar to that of the sacrificial layers 206. In one example, the cladding layer 216 may be formed of silicon germanium (SiGe). This common composition allows selective removal of the sacrificial layers 206 and the cladding layer 216 in a subsequent process. In some embodiments, the cladding layer 216 may be conformally and epitaxially grown using vapor phase epitaxy (VPE) or molecular beam epitaxy (MBE). The deposition process of the cladding layer 216 is selected that the cladding layer 216 is amorphous and is conformally deposited on the surfaces of the workpiece 200, including surfaces of the fin-shaped structures 212 and the isolation feature 214. In some instances, the cladding layer 216 may have a thickness between about 5 nm and about 10 nm. After the cladding layer 216 is deposited over the workpiece 200, the workpiece 200 is subject to an etch back process to recess the cladding layer 216 until the cladding layer 216 on the top-facing surfaces are removed. That is, after the etch back process, top surfaces of the hard mask layer 210 and the isolation feature 214 may be exposed.

Figure 4B:
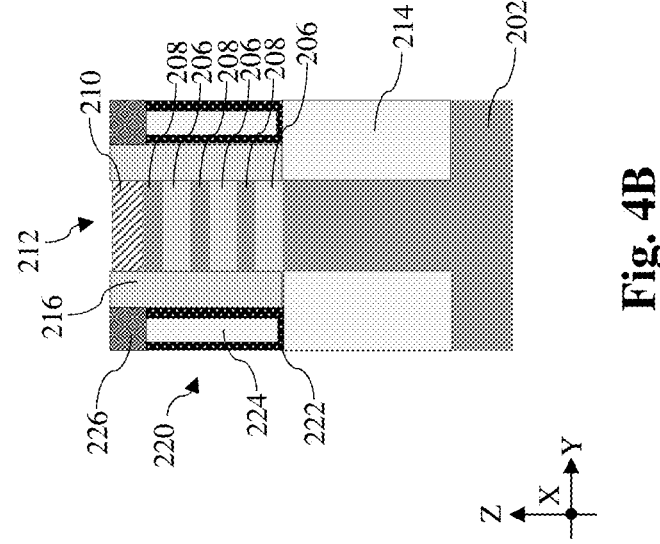
Figure 4A:
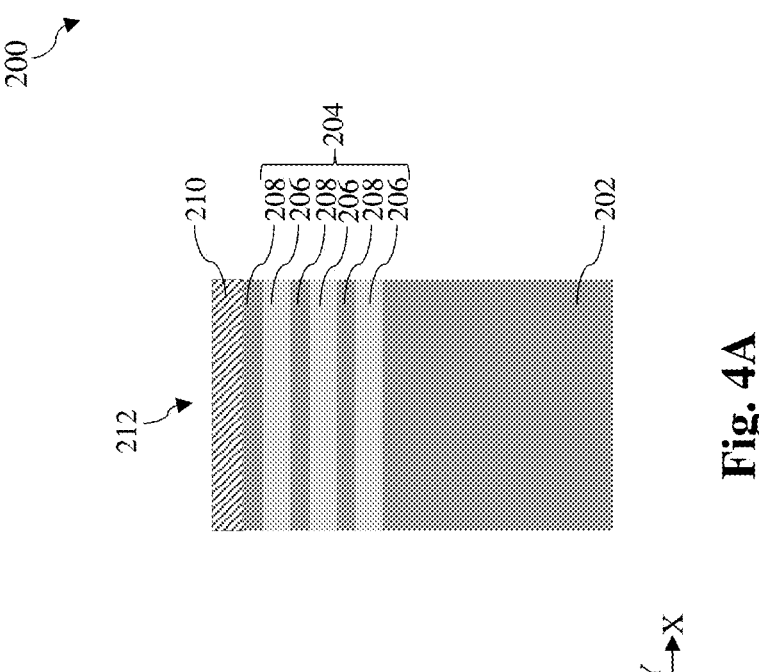

Referring still to FIGS. 4A and 4B, block 108 also forms a dielectric fin 220. In some embodiments, dielectric fins 220 may be are formed into the trenches formed after the cladding layer 216 is formed. In the depicted embodiments, each of the dielectric fins 220 includes multiple layers. In an example process, a liner 222 is conformally deposited over the workpiece 200, including over the cladding layer 216 and the fin-shaped structure 212. The liner 222 may be deposited using PECVD, ALD, or a suitable method. A filler layer 224 is then deposited over the liner 222 on the workpiece 200 using CVD, SACVD, FCVD, ALD, spin-on coating, and/or other suitable process. The liner 222 may include silicon, silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. The filler layer 224 may include silicon oxide, silicon carbide, silicon oxynitride, silicon oxycarbonitride, or a suitable dielectric material. After the deposition of the liner 222 and the filler layer 224, the workpiece 200 is planarized using a planarization process, such as a chemical mechanical polishing (CMP) process, until the liner 222 and the filler layer 224 over the cladding layer 216 are removed. After the planarization, the filler layer 224 and a portion of the liner 222 are selectively and partially recessed and a helmet layer 226 is then deposited over the workpiece 200. The helmet layer 226 may include silicon nitride, silicon carbide, silicon carbonitride, silicon oxycarbonitride, aluminum oxide, aluminum nitride, aluminum oxynitride, zirconium oxide, zirconium nitride, zirconium aluminum oxide, hafnium oxide, or a suitable dielectric material. The workpiece 200 is then planarized again using a CMP process to remove excess helmet layer 226 on the cladding layer 216. At this point, the dielectric fins 220 are substantially formed. Each of the dielectric fins 220 includes a helmet layer 226 disposed over the filler layer 224 and the liner 222. In one embodiment, the liner 222 include silicon nitride or silicon carbonitride the filler layer 224 includes silicon oxide, and the helmet layer 226 includes silicon carbonitride, silicon nitride, aluminum oxide, aluminum nitride, aluminum oxynitride, zirconium oxide, zirconium nitride, zirconium aluminum oxide, or hafnium oxide.

Figure 5B:
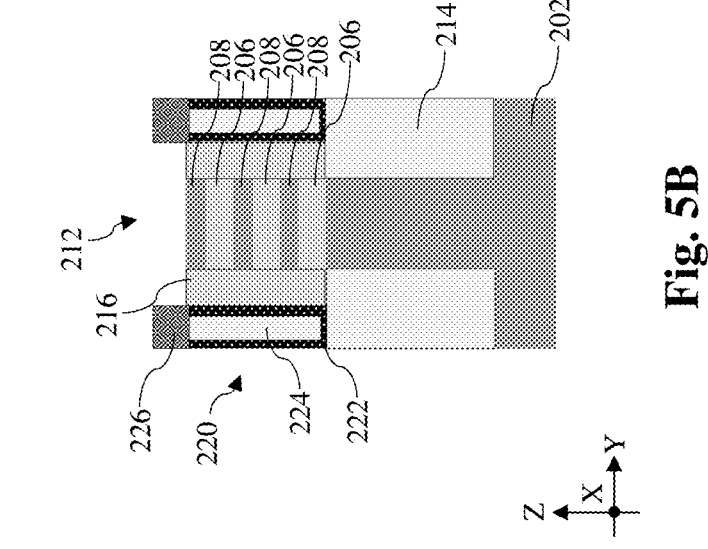
Figure 5A:
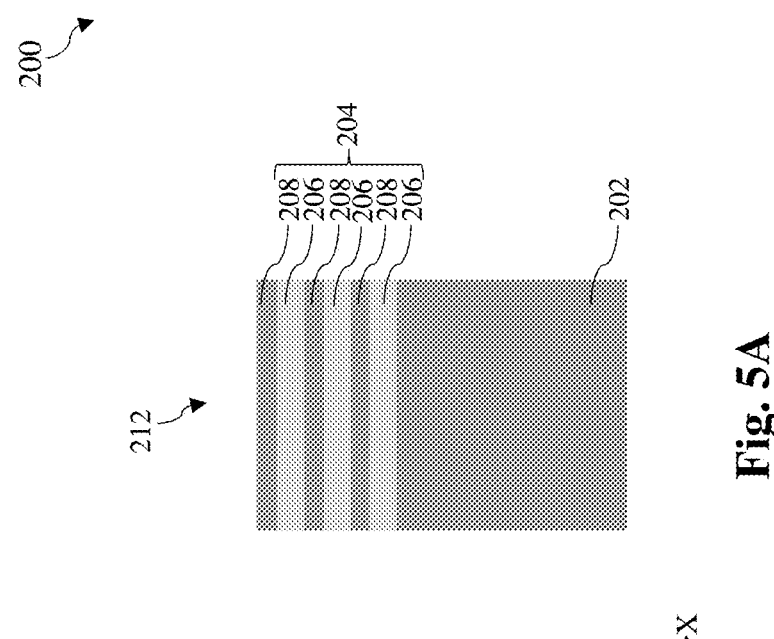

Referring to FIGS. 5A and 5B, after the formation of the dielectric fins 220, the workpiece 200 is anisotropically etched to selectively remove a portion of the cladding layer 216 and the hard mask layer 210 to expose the topmost channel layers 208, without substantially damaging the helmet layer 226. The anisotropic etch process may include a single stage etch process or a multi-stage etch process. When the anisotropic etch process is single-stage, it is selective to semiconductor materials (e.g. silicon and silicon germanium) and silicon nitride. When the anisotropic etch process is multi-stage, the first stage may be selective to semiconductor materials (e.g. silicon and silicon germanium) and the second stage may be selective to silicon nitride. In some implementations, the anisotropic etch process may include hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Figure 6B:
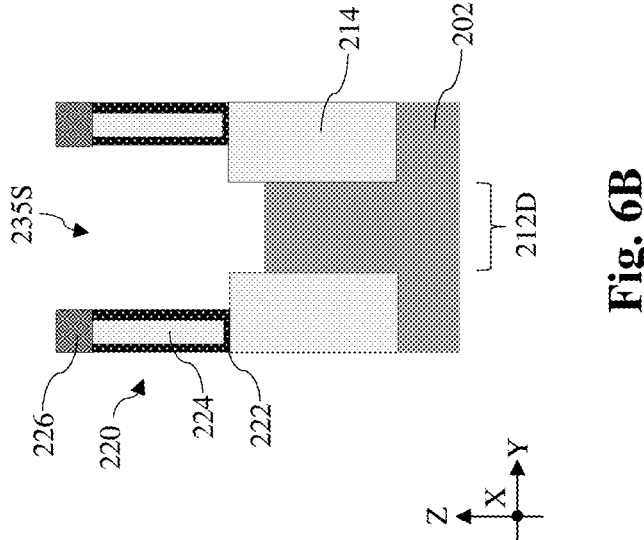
Figure 6A:
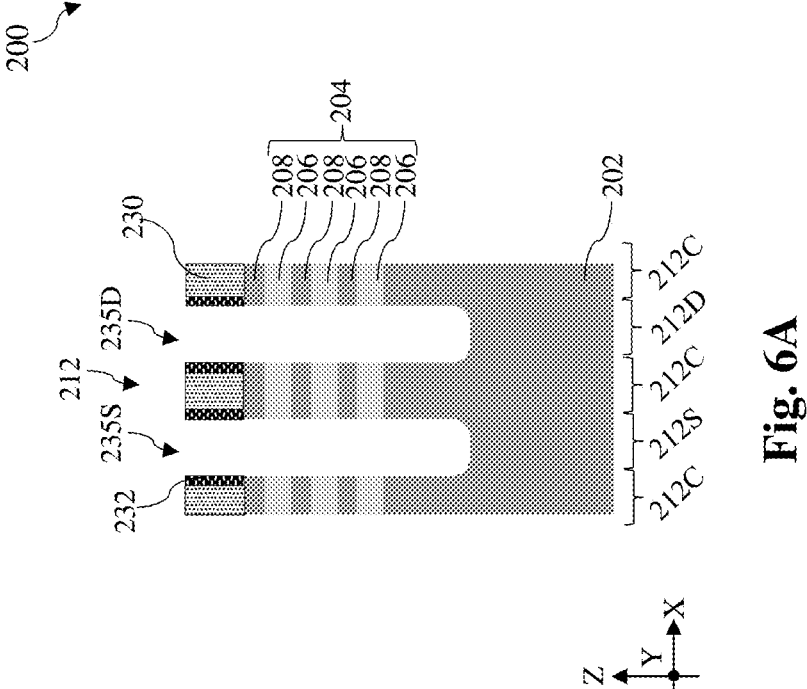

Referring to FIGS. 1, 6A and 6B, method 100 includes a block 110 where a dummy gate stack 230 is formed over a channel region 212C of the fin-shaped structure 212. In some embodiments, a gate replacement process (or gate-last process) is adopted where the dummy gate stack 230 serves as a placeholder for a functional gate structure. Other processes and configuration are possible. While not explicitly shown, the dummy gate stack 230 may include a dummy dielectric layer and a dummy electrode disposed over the dummy dielectric layer. The regions of the fin-shaped structures 212 underlying the dummy gate stack 230 may be referred to as channel regions 212C. Each of the channel regions in a fin-shaped structure 212 is sandwiched between a source region 212S and a drain region 212D. In an example process, the dummy dielectric layer is blanketly deposited over the workpiece 200 by CVD. A material layer for the dummy electrode is then blanketly deposited over the dummy dielectric layer. The dummy dielectric layer and the material layer for the dummy electrode are then patterned using photolithography processes to form the dummy gate stack 230. In some embodiments, the dummy dielectric layer may include silicon oxide and the dummy electrode may include polycrystalline silicon (polysilicon).

After the dummy gate stacks 230 are formed, block 110 also include operations to form at least one gate spacer 232 along sidewalls of the dummy gate stacks 230. The at least one gate spacer 232 may include two or more gate spacer layers. Dielectric materials for the at least one gate spacer 232 may be selected to allow selective removal of the dummy gate stack 230 without substantially damaging the at least one gate spacer 232. Suitable dielectric materials may include silicon nitride, silicon oxycarbonitride, silicon carbonitride, silicon oxide, silicon oxycarbide, silicon carbide, silicon oxynitride, and/or combinations thereof. In an example process, the at least one gate spacer 232 may be conformally deposited over the workpiece 200 using CVD, subatmospheric CVD (SACVD), or ALD. In one embodiments, the at least one gate spacer 232 includes two gate spacers, one formed of silicon nitride and the other formed of silicon carbonitride. Other combinations are fully envisioned. In some embodiments, after the deposition of the at least one gate spacer 232, the at least one gate spacer 232 is etched back to expose the top surfaces of the fin-shaped structures 212 in the source region 212S and the drain region 212D.

Referring to FIGS. 1, 6A and 6B, method 100 includes a block 112 where the source regions 212S and drain regions 212D of the fin-shaped structures 212 are recessed to form source openings 235S and drain openings 235D. FIG. 6A illustrates a fragmentary cross-sectional view of the fin-shaped structure 212, when viewed from a side of the fin-shaped structure 212. FIG. 6B illustrates a fragmentary cross-sectional view of the fin-shaped structure 212 at a drain region 212D along the lengthwise direction (X direction) of the fin-shaped structure 212. With the dummy gate stack 230 and the at least one gate spacer 232 serving as an etch mask, the workpiece 200 is anisotropically etched in the source region 212S and the drain region 212D to form the source opening 235S and a drain opening 235D. As shown in FIGS. 6A and 6B, the source opening 235S and the drain opening 235D not only extend through the channel layers 208 and the sacrificial layers 206, but also extend through a portion of the substrate 202. Operations at block 112 may substantially remove the top portions 212T of fin-shaped structures 212 in the source region 212S and the drain region 212D. The anisotropic etch at block 112 may include a dry etch process or a suitable etch process. For example, the dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. As shown in FIGS. 6A and 6B, the dry etch process at block 112 may etch the helmet layer 226 and the liner 222 at a slower rate and leave them substantially unetched. Sidewalls of the plurality of channel layers 208, the plurality of the sacrificial layers 206, and the cladding layer 216 are exposed in the source opening 235S and the drain opening 235D.

Figure 7B:
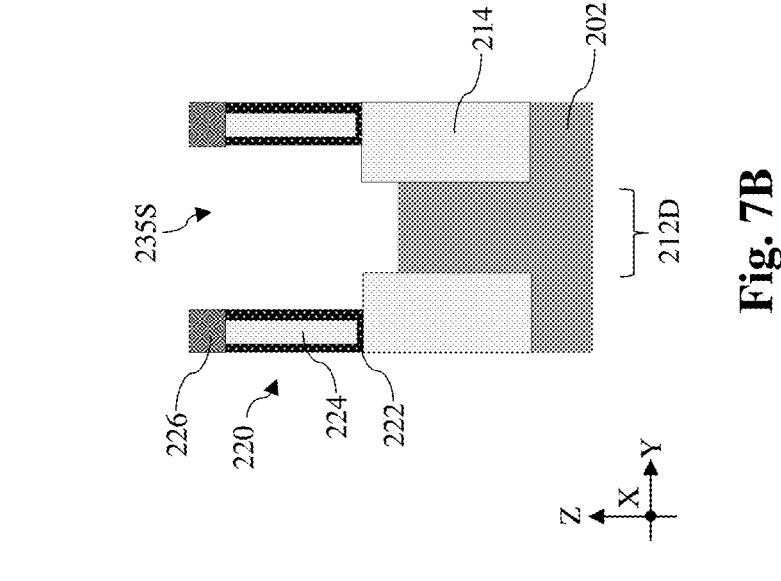
Figure 7A:
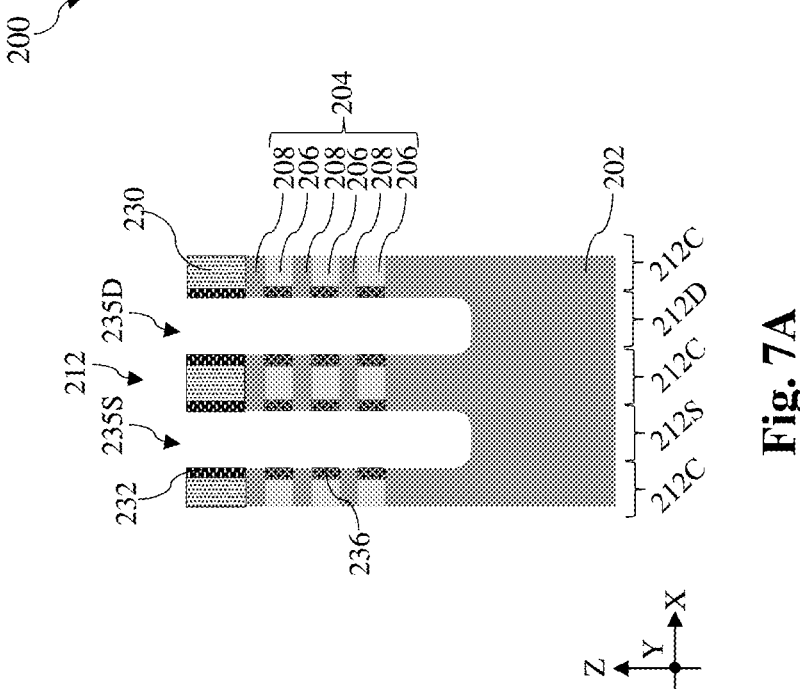

Referring to FIGS. 1, 7A and 7B, method 100 includes a block 114 where inner spacer features 236 are formed. Referring to FIG. 7A, at block 114, the sacrificial layers 206 exposed in the source openings 235S and drain openings 235D are first selectively and partially recessed to form inner spacer recesses, while the exposed channel layers 208 are substantially unetched. Because the cladding layer 216 and the sacrificial layers 206 share a similar composition, the cladding layer 216 may be etched at block 114 as well. In an embodiment where the channel layers 208 consist essentially of silicon (Si), sacrificial layers 206 consist essentially of silicon germanium (SiGe), and the cladding layer 216 consists essentially of silicon germanium (SiGe), the selective and partial recess of the sacrificial layers 206 and the cladding layer 216 may include a SiGe oxidation process followed by a SiGe oxide removal. In that embodiments, the SiGe oxidation process may include use of ozone. In some other embodiments, the selective recess may include a selective isotropic etching process (e.g., a selective dry etching process or a selective wet etching process), and the extent at which the sacrificial layers 206 and the cladding layer 216 are recessed is controlled by duration of the etching process. The selective dry etching process may include use of one or more fluorine-based etchants, such as fluorine gas or hydrofluorocarbons. The selective wet etching process may include APM etch (e.g., ammonia hydroxide-hydrogen peroxide-water mixture). After the formation of the inner spacer recesses, an inner spacer material layer is then conformally deposited using CVD or ALD over the workpiece 200, including over and into the inner spacer recesses and the space left behind by the removed portion of the cladding layer 216. The inner spacer material may include silicon nitride, silicon oxycarbonitride, silicon carbonitride, silicon oxide, silicon oxycarbide, silicon carbide, or silico oxynitride. After the deposition of the inner spacer material layer, the inner spacer material layer is etched back to form inner spacer features 236, as illustrated in FIG. 7A.

Figures 8A, 8B:
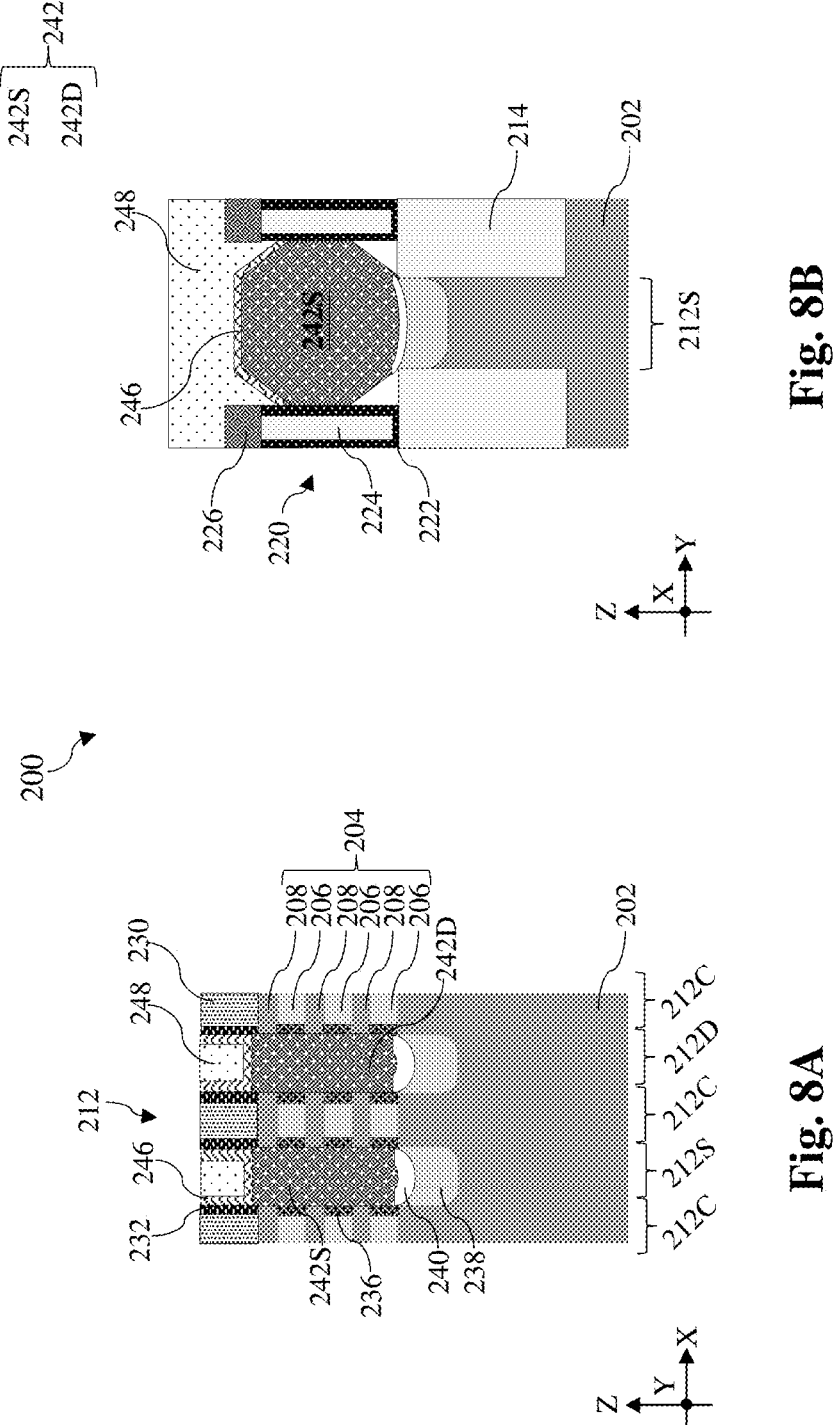

Referring to FIGS. 1, 8A and 8B, method 100 includes a block 116 where a dummy epitaxial feature 238, a first epitaxial layer 240, and a second epitaxial layer 242 are deposited to form a source feature 242S and a drain feature 242D. In some embodiments, the dummy epitaxial feature 238 may include silicon germanium (SiGe) or a semiconductor material that is different from the semiconductor material that forms the substrate 202. In some instances, the dummy epitaxial feature 238 may be doped with an n-type dopant, such as phosphorus (P) or arsenic (As) or a p-type dopant, such as boron (B) or gallium (Ga). This compositional difference provides etch selectivity in a subsequent operation for self-aligned formation of a backside contact opening. Both the first epitaxial layer 240 and the second epitaxial layer 242 are formed of doped semiconductor materials and their compositions depend on the conductivity type of the MBC transistor desired. When an n-type MBC transistor is desired, both the first epitaxial layer 240 and the second epitaxial layer 242 may include silicon (Si) doped with an n-type dopant, such as phosphorus (P) or arsenic (As). When a p-type MBC transistor is desired, both the first epitaxial layer 240 and the second epitaxial layer 242 may include silicon germanium (SiGe) doped with a p-type dopant, such as boron (B) or gallium (Ga). In some embodiments, both the first epitaxial layer 240 and the second epitaxial layer 242 may share the same semiconductor material and the same dopant species, they have different doping concentrations. For example, when an n-type MBC transistor is desired, the first epitaxial layer 240 may have a phosphorus (P) doping concentration between $5 \times 10^{20}$ atoms/cm$^3$ and about $1 \times 10^{21}$ atoms/cm$^3$ and the second epitaxial layer 242 may have a phosphorus (P) doping concentration between $1 \times 10^{20}$ atoms/cm$^3$ and about $5 \times 10^{21}$ atoms/cm$^3$. When a p-type MBC transistor is desired, the first epitaxial layer 240 may have a boron (B) doping concentration between $3 \times 10^{20}$ atoms/cm$^3$ and about $8 \times 10^{20}$ atoms/cm$^3$ and the second epitaxial layer 242 may have a boron (B) doping concentration between $8 \times 10^{20}$ atoms/cm$^3$ and about $4 \times 10^{21}$ atoms/cm$^3$.

In some alternative embodiments, the first epitaxial layer 240 and the second epitaxial layer 242 may include different dopants of the same conductivity types. For example, when an n-type MBC transistor is desired, the first epitaxial layer 240 may be doped with arsenic (As) and the second epitaxial layer 242 may be doped with phosphorus (P). When a p-type MBC transistor is desired, the first epitaxial layer 240 may be doped with gallium (Ga) and the second epitaxial layer 242 may be doped with boron (B).

At block 114, the dummy epitaxial feature 238 is deposited first. The first epitaxial layer 240 is then deposited over the dummy epitaxial feature 238. Thereafter, the second epitaxial layer 242 is deposited over the first epitaxial layer 240. Each of the dummy epitaxial feature 238, the first epitaxial layer 240, and the second epitaxial layer 242 may be epitaxially deposited using molecular beam epitaxy (MBE), vapor-phase epitaxy (VPE), ultra-high vacuum CVD (UHV-CVD)), and/or other suitable epitaxial growth processes. In an example process, silicon germanium is epitaxially deposited into the source opening 235S and the drain opening 235D over the exposed substrate 202. In some implementations, in order to remove dummy epitaxial feature 238 from surfaces of the channel layer 208, an etch back may be performed to recess the dummy epitaxial feature 238. The first epitaxial layer 240 is then deposited over the dummy epitaxial feature 238 in the source opening 235S and the drain opening 235D. Similarly, in order to remove first epitaxial layer 240 from surfaces of the channel layer 208, in some embodiments, an etch back process may be performed to the deposited first epitaxial layer 240 to expose the sidewalls of the channel layers 208. After the deposition of the first epitaxial layer 240, the second epitaxial layer 242 is selectively deposited on the sidewalls of the channel layers 208 as well as the first epitaxial layer 240. In some implementations, a pre-clean process may be performed after the etch back of the dummy epitaxial feature 238 or after the etch back of the first epitaxial layer 240 to provide an oxide-free and debris-free surface for the next epitaxial layer. The pre-clean process may include use of RCA SC-1 (a mixture of ammonium hydroxide, hydrogen peroxide and water) and/or RCA SC-2 (a mixture of hydrochloric acid, hydrogen peroxide and water). The second epitaxial layer 242 deposited in a source opening 235S may be referred to as a source feature 242S and the second epitaxial layer 242 deposited in a drain opening 235D may be referred to as a drain feature 242D. It is noted that, in the depicted embodiment and with respect to one MBC transistor, the source feature 242S and the drain feature 242D are substantially identical in terms of composition. They are referred to differently due to their locations (i.e., in the source opening 235S or in the drain opening 235D).

As shown in FIGS. 8A and 8B, the dummy epitaxial feature 238 is disposed in the base portion 212B and does rise above the top surface of the isolation feature 214. The second epitaxial layer 242 (including the source feature 242S and the drain feature 242D) is disposed substantially over the top surface of the isolation feature 214. As shown in FIG. 8A, the second epitaxial layer 242 is in contact with the sidewalls of the channel layers 208 and the inner spacer features 236. The first epitaxial layer 240 is disposed between the dummy epitaxial feature 238 and the second epitaxial layer 242. The first epitaxial layer 240 is therefore disposed around the level of the top surface of the isolation feature 214. The second epitaxial layer 242 is also in contact with adjacent dielectric fins 220, while the first epitaxial layer 240 and the dummy epitaxial feature 238 are spaced apart from the dielectric fins 220.

Referring to FIGS. 1, 8A and 8B, method 100 includes a block 118 where a contact etch stop layer (CESL) 246 and an interlayer dielectric (ILD) layer 248 are deposited. In an example process, the CESL 246 is first conformally deposited over the workpiece 200 and then the ILD layer 248 is blanketly deposited over the CESL 246. The CESL 246 may include silicon nitride, silicon oxide, silicon oxynitride, and/or other materials known in the art. The CESL 246 may be deposited using ALD, plasma-enhanced chemical vapor deposition (PECVD) process and/or other suitable deposition or oxidation processes. In some embodiments, the ILD layer 248 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 248 may be deposited by spin-on coating, an FCVD process, or other suitable deposition technique. In some embodiments, after formation of the ILD layer 248, the workpiece 200 may be annealed to improve integrity of the ILD layer 248. To remove excess materials and to expose top surfaces of the dummy gate stacks 230, a planarization process (such as chemical mechanical polishing (CMP) process) may be performed to the workpiece 200 to provide a planar top surface. Top surfaces of the dummy gate stack 230 are exposed on the planar top surface.

Figure 9B:
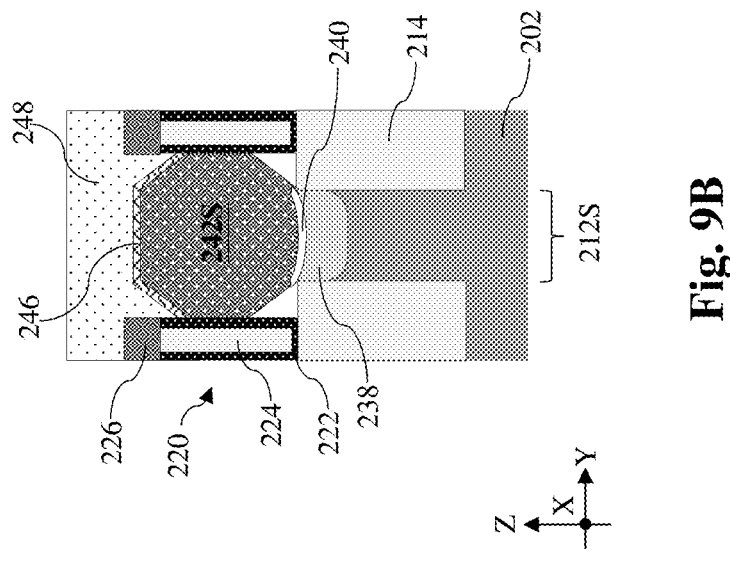
Figure 9A:
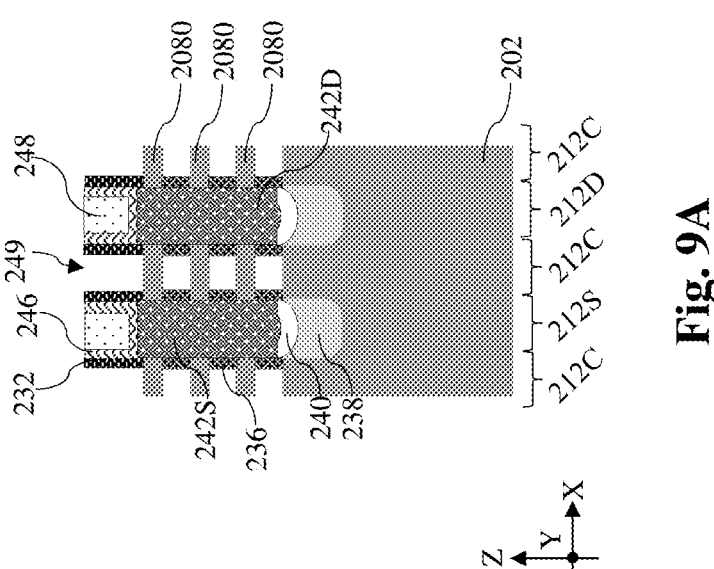
Figures 10A, 10B, 10C:
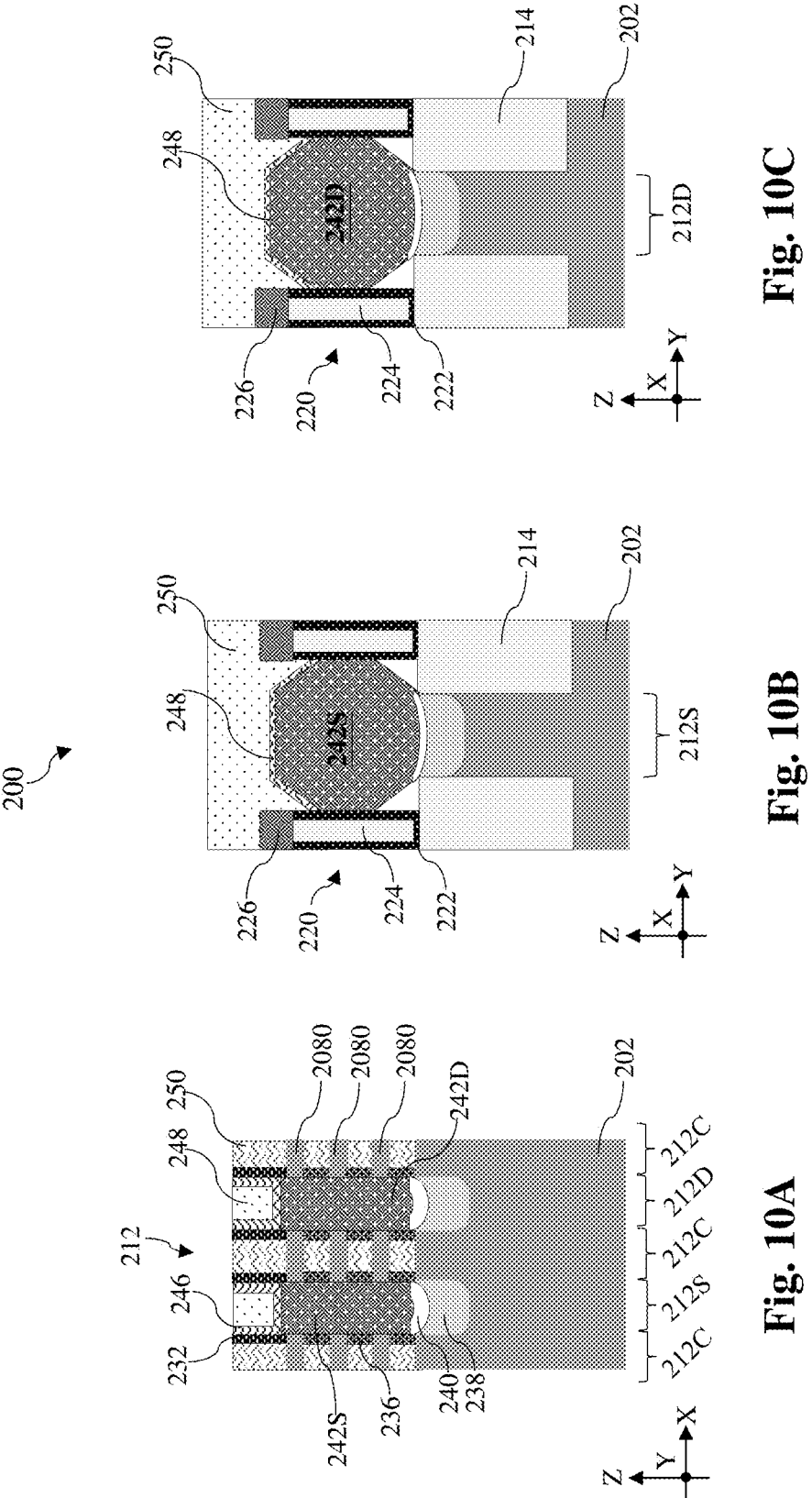

Referring to FIGS. 1, 9A and 9B, method 100 includes a block 120 where the dummy gate stack 230 is removed and channel members 2080 are released. After the dummy gate stack 230 is exposed by planarization at block 118, the dummy gate stack 230 is removed from the workpiece 200 by a selective etch process. The selective etch process may be a selective wet etch process, a selective dry etch process, or a combination thereof. In the depicted embodiments, the selective etch process selectively removes the dummy dielectric layer and the dummy electrode in the dummy gate stack 230. The removal of the dummy gate stack 230 results in a gate trench 249 over the channel region 212C. After the removal of the dummy gate stack 230, channel layers 208, sacrificial layers 206, and the cladding layer 216 (not explicitly shown in FIG. 9A) in the channel region 212C are exposed in the gate trench 249. Due to their similar composition, the exposed sacrificial layers 206 between the channel layers 208 and the cladding layer 216 may be selectively removed to release the channel layers 208 to form channel members 2080, shown in FIG. 9A. The channel members 2080 are vertically stacked along the Z direction. The selective removal of the sacrificial layers 206 and the cladding layer 216 may be implemented by selective dry etch, selective wet etch, or other selective etch processes. In some embodiments, the selective wet etching includes an APM etch (e.g., ammonia hydroxide-hydrogen peroxide-water mixture). In some alternative embodiments, the selective removal includes silicon germanium oxidation followed by a silicon germanium oxide removal. For example, the oxidation may be provided by ozone clean and then silicon germanium oxide removed by an etchant such as NH4OH. With the removal of the sacrificial layers 206 and the cladding layer 216 in the channel region, the liner 222, the channel members 2080, the top surface of the base portion 212B, and the isolation feature 214 are exposed in the gate trench 249.

Figures 11A, 11B, 11C:
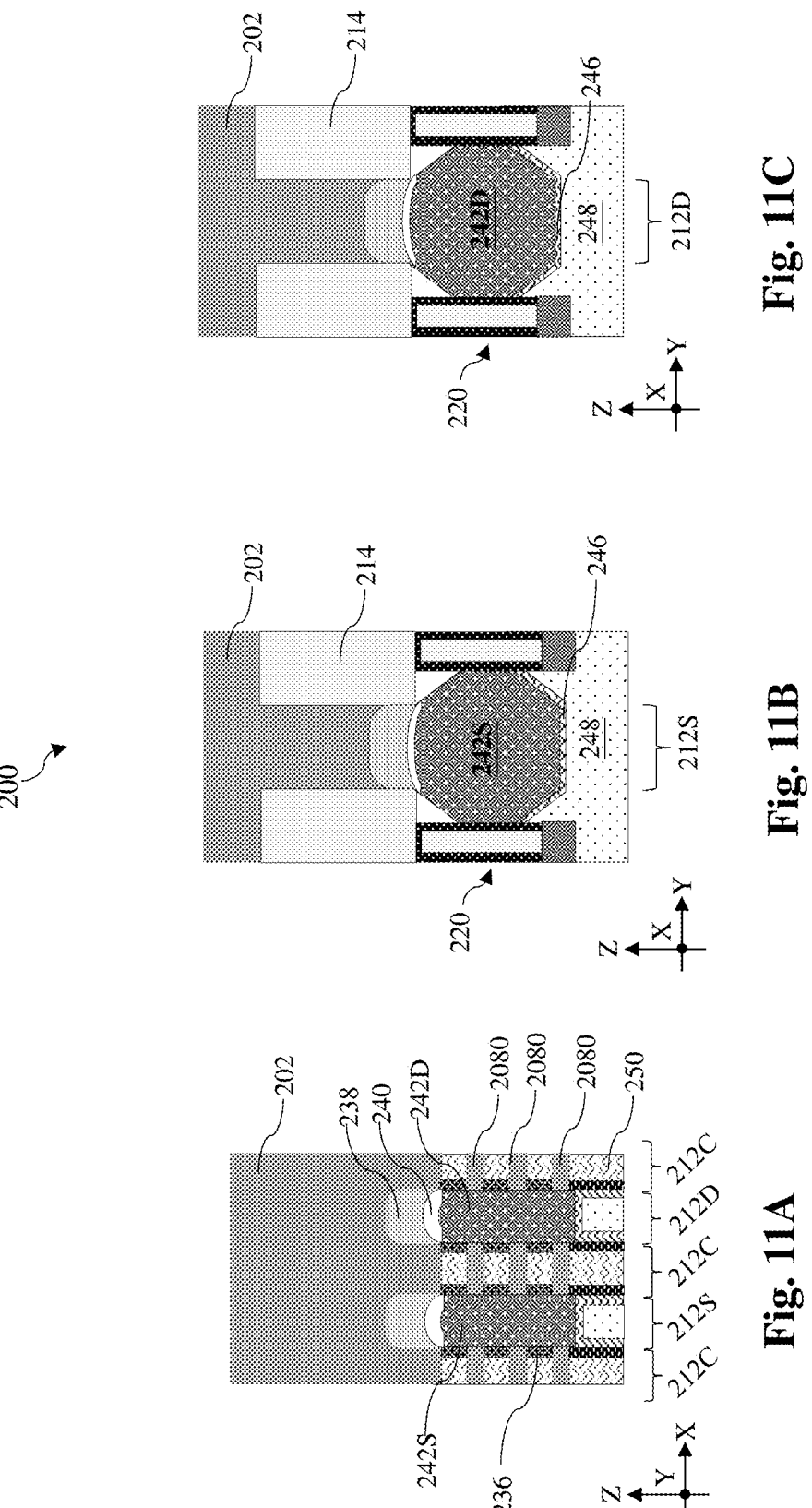

Referring to FIGS. 1, 10A, 10B, and 10C, method 100 includes a block 122 where a gate structure 250 is formed to wrap around each of the channel members 2080. The gate structure 250 may include an interfacial layer, a gate dielectric layer over the interfacial layer, and a gate electrode layer over the gate dielectric layer. In some embodiments, the interfacial layer may include silicon oxide and may be formed as result of a pre-clean process. An example pre-clean process may include use of RCA SC-1 (ammonia, hydrogen peroxide and water) and/or RCA SC-2 (hydrochloric acid, hydrogen peroxide and water). The pre-clean process oxidizes the exposed surfaces of the channel members 2080 and the substrate 202 to form the interfacial layer. The gate dielectric layer is then deposited over the interfacial layer using ALD, CVD, and/or other suitable methods. The gate dielectric layer may include high-K dielectric materials. As used herein, high-k dielectric materials include dielectric materials having a high dielectric constant, for example, greater than that of thermal silicon oxide (~3.9). In one embodiment, the gate dielectric layer may include hafnium oxide. Alternatively, the gate dielectric layer may include other high-k dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HMO), hafnium titanium oxide (HfTiO), $(Ba,Sr)TiO_3$ (BST), silicon nitride (SiN), silicon oxynitride (SiON), combinations thereof, or other suitable material. After the formation or deposition of the gate dielectric layer, a gate electrode layer is deposited over the gate dielectric layer. The gate electrode layer may be a multi-layer structure that includes at least one work function layer and a metal fill layer. By way of example, the at least one work function layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), or tantalum carbide (TaC). The metal fill layer may include aluminum (Al), tungsten (W), nickel (Ni), titanium (Ti), ruthenium (Ru), cobalt (Co), platinum (Pt), tantalum silicon nitride (TaSiN), copper (Cu), other refractory metals, or other suitable metal materials or a combination thereof. In various embodiments, the gate electrode layer may be formed by ALD, PVD, CVD, e-beam evaporation, or other suitable process. In various embodiments, a planarization process, such as a CMP process, may be performed to remove excessive materials to provide a substantially planar top surface of the gate structures. Referring to FIG. 11A, the gate structure 250 wraps around each of the channel members 2080.

In some embodiments, before the workpiece 200 is flipped over to form backside contacts and interconnect structures, frontside contacts and interconnect structures are formed. In some embodiments illustrated in FIGS. 18A, 18B and 18C, a frontside drain contact 280 may be formed through the ILD layer 248 and the CESL 246 to come in contact with the drain feature 242D. The frontside drain contact 280 includes a drain silicide feature 282 and a drain plug 284. In an example process, a frontside drain contact opening is formed through the ILD layer 248 and the CESL 246 to expose the drain feature 242D. To form the drain silicide feature 282, a metal layer is deposited over the exposed surface of the drain feature 242D and an anneal process is performed to bring about silicidation reaction between the metal layer and the drain feature 242D. Suitable metal layer may include titanium (Ti), tantalum (Ta), nickel (Ni), cobalt (Co), or tungsten (W). The drain silicide feature 282 may include titanium silicide (TiSi), titanium silicon nitride (TiSiN), tantalum silicide (TaSi), tungsten silicide (WSi), cobalt silicide (CoSi), or nickel silicide (NiSi). Although not explicitly shown, the excess metal layer that does not form the drain silicide feature 282 may be removed. After the formation of the drain silicide feature 282, a metal fill layer may be deposited into the frontside drain contact opening to form the drain plug 284. The metal fill layer may include aluminum (Al), rhodium (Rh), ruthenium (Ru), copper (Cu), iridium (Ir), or tungsten (W). A planarization process, such as a CMP process, may follow to remove excess materials and provide a planar top surface. The frontside drain contact 280 is electrically coupled to the drain feature 242D.

While not explicitly shown, a frontside interconnect structure may be formed over the workpiece 200 before the workpiece 200 is flipped over. The frontside interconnect structure may include multiple intermetal dielectric (IMD) layers and multiple metal lines or contact vias in each of the IMD layers. In some instances, the IMD layers and the ILD layer 248 may share similar composition. The metal lines and contact vias in each IMD layer may be formed of metal, such as aluminum (Al), tungsten (W), ruthenium (Ru), or copper (Cu). In some embodiments, the metal lines and contact vias may be lined by a barrier layer to insulate the metal lines and contact vias from the IMD layers and to prevent electro-migration.

Referring to FIGS. 1, 11A, 11B, 11C, 12A, 12B, 12C, 13A, 13B, 13C, 14A, 14B, and 14C, method 100 includes a block 124 where a second backside source contact opening 2620 is formed. In some embodiments, operations at block 124 may include flipping the workpiece 200 up-side-down (shown in FIGS. 11A, 11B and 11C), anisotropically etching the substrate 202 to expose the dummy epitaxial feature 238 (shown in FIGS. 12A, 12B and 12C), isotropically and selectively etching the dummy epitaxial feature 238 to expose the first epitaxial layer 240 (shown in FIGS. 13A, 13B and 13C), and depositing a dielectric barrier layer 264 and etching back (shown in FIGS. 14A, 14B and 14C). To flip the workpiece 200 up-side-down, a carrier substrate (not explicitly shown) is bonded to the workpiece 200 (or the frontside interconnect structure). In some embodiments, the carrier substrate may be bonded to the workpiece 200 by fusion bonding, by use of an adhesion layer, or a combination thereof. In some instances, the carrier substrate may be formed of semiconductor materials (such as silicon), sapphire, glass, polymeric materials, or other suitable materials. In embodiments where fusion bonding is used, the carrier substrate includes a bottom oxide layer and the workpiece 200 includes a top oxide layer. After both the bottom oxide layer and top oxide layer are treated, they are placed in plush contact with one another for direct bonding at room temperature or at an elevated temperature. Once the carrier substrate is bonded to the workpiece 200, the workpiece 200 is flipped over, as shown in FIGS. 11A, 11B and 11C. As representatively shown in FIGS. 12A, 12B and 12C, after the workpiece 200 is flipped over, the back side of the workpiece 200 is planarized until the isolation feature (not explicitly shown).

Figures 12A, 12B, 12C:
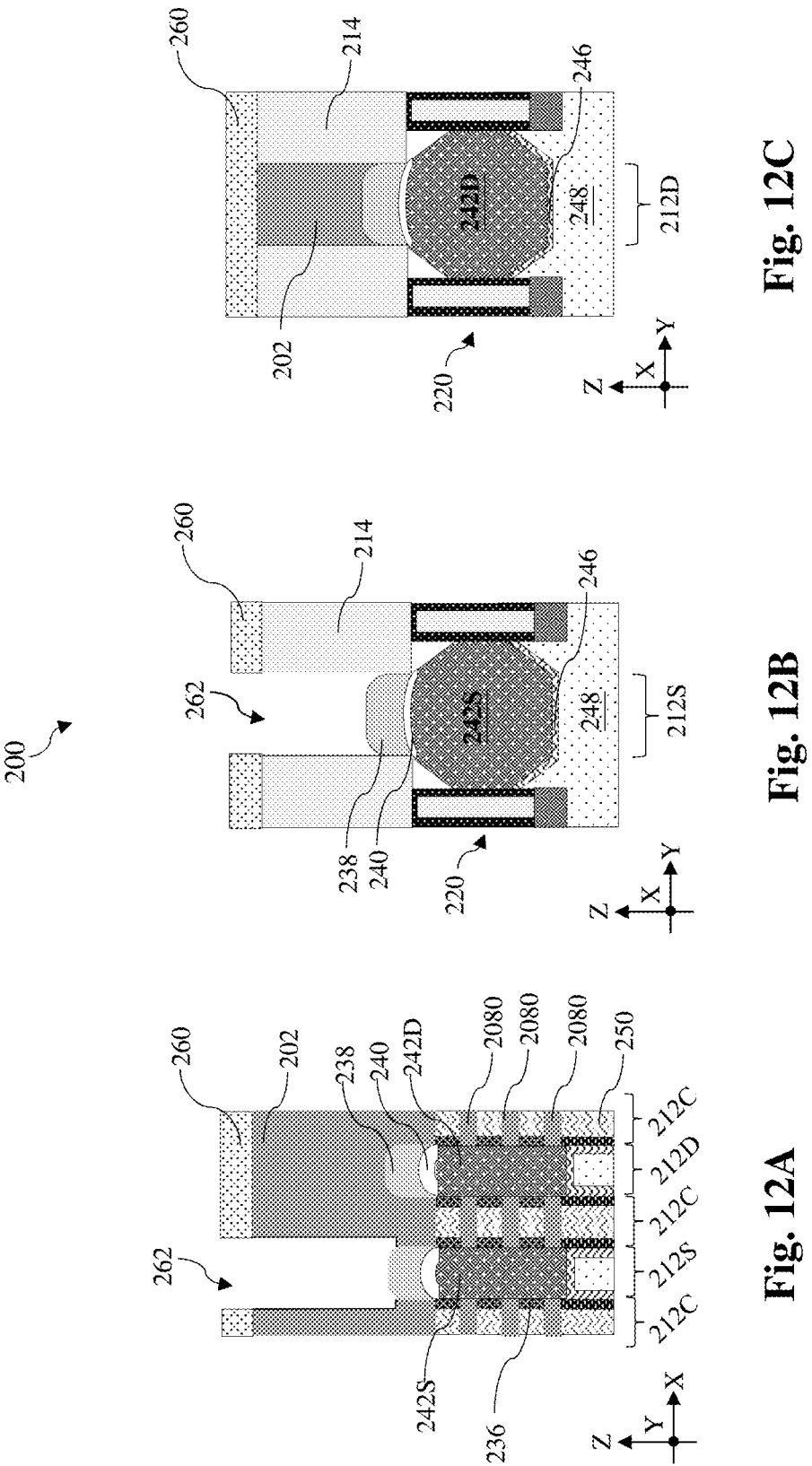

Referring still to FIGS. 12A, 12B and 12C, a patterned hard mask 260 is formed over the back side of the workpiece 200. The patterned hard mask 260 selectively expose the source region 212S while covering the drain region 212D. The substrate 202 is then anisotropically etched until the dummy epitaxial feature 238 is exposed in a first backside source contact opening 262. In some embodiments, the anisotropic etching at block 124 may be an anisotropic dry etch process that includes use of oxygen ($O_2$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. In one embodiment, the anisotropic dry etch may include use of a mixture of hydrogen bromide (HBr), oxygen ($O_2$) and chlorine ($Cl_2$). In some implementations, the etchant flow rate may be between about 5 standard cubic centi-meter per minute (SCCM) and about 200 SCCM, the chamber pressure is between about 1 mTorr and about 100 mTorr, the process time may be between about 5 seconds and about 180 seconds, and a bias radio frequency (RF) power between about 50 W and about 250 W. The selective dry etch process is not selective to the substrate 202 and may also etch the dummy epitaxial feature 238. After the formation of the first backside source contact opening 262, the patterned hard mask 260 may be removed by etching, ashing, or other suitable processes.

Figures 13A, 13B, 13C:
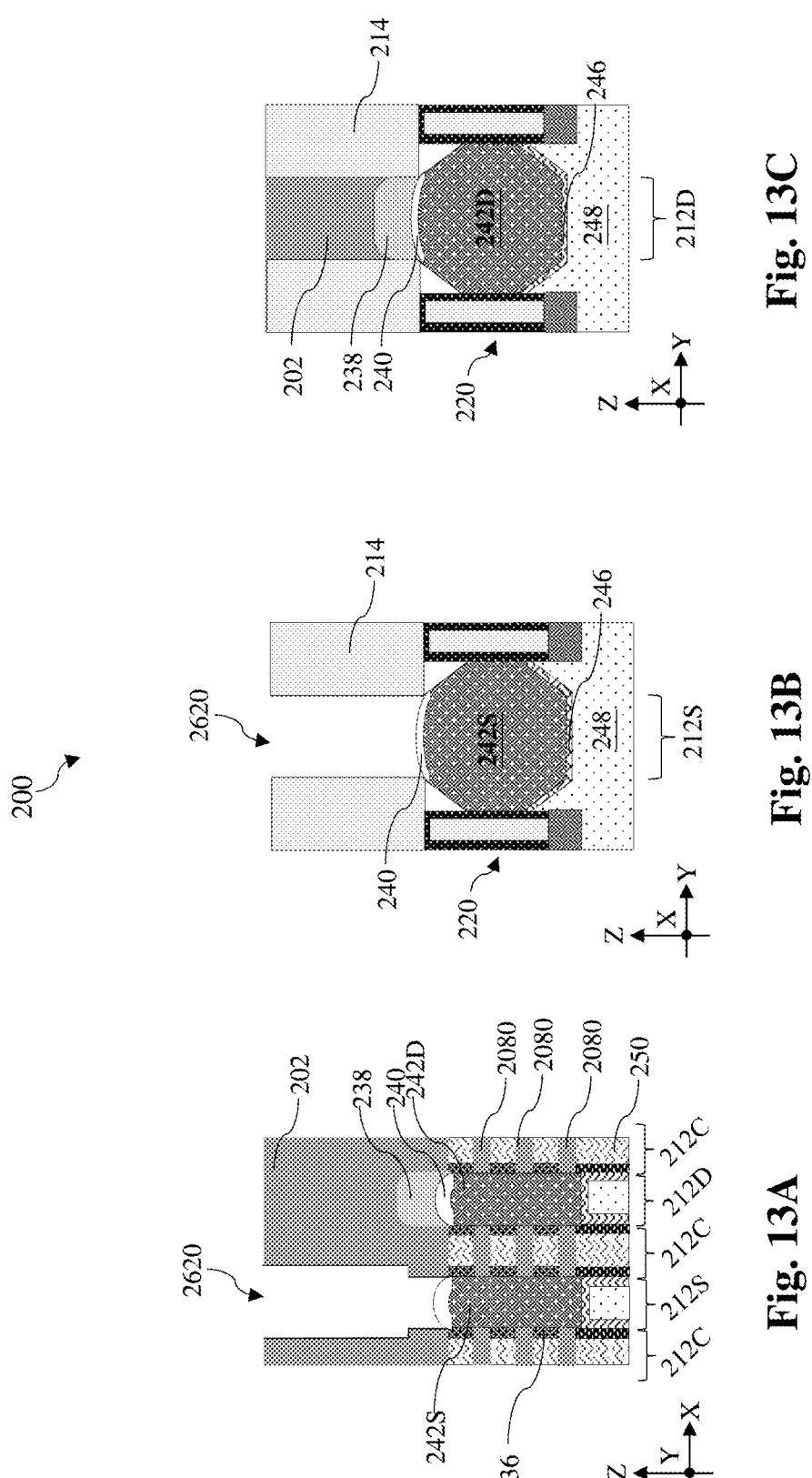

Referring now to FIGS. 13A, 13B and 13C, the dummy epitaxial feature 238 exposed in the first backside source contact opening 262 is selectively and isotropically etched to expose the first epitaxial layer 240. As shown in the figures, the selective removal of the dummy epitaxial feature 238 extends the first backside source contact opening 262 toward the source feature 242S to form a second backside source contact opening 2620. In some embodiments, the selective and isotropic etch at block 124 may be an isotropic dry etch that includes a fluorine-containing gas (e.g., fluorine ($F_2$), $NF_3$, $CF_4$, $SF_6$, $CH_2F_2$, $CHF_3$, and/or $C_2F_6$) and hydrogen fluoride (HF). In one embodiment, the selective and isotropic dry etch may include use of a mixture of fluorine ($F_2$) and hydrogen fluoride (HF). In some implementations, the etchant flow rate may be between about 5 SCCM and about 200 SCCM, the chamber pressure is between about 1 mTorr and about 100 mTorr, the process time may be between about 5 seconds and about 180 seconds, and a plasma power may be between about 50 W and 250 W. It is noted that as the isotropic etch is not directional, plasma of the isotropic etch is generated by a remote plasma system (RPS). As shown in FIGS. 13A, 13B and 13C, because the formation of the first backside source contact opening 262 is anisotropic and the extension of the first backside source contact opening 262 is selective to the dummy epitaxial feature 238, the second backside source contact opening 2620 includes a step-wise width change. Here, a step-wise width change means that the width of the second backside source contact opening 2620 along the X direction includes a step change.

Figures 14A, 14B, 14C:
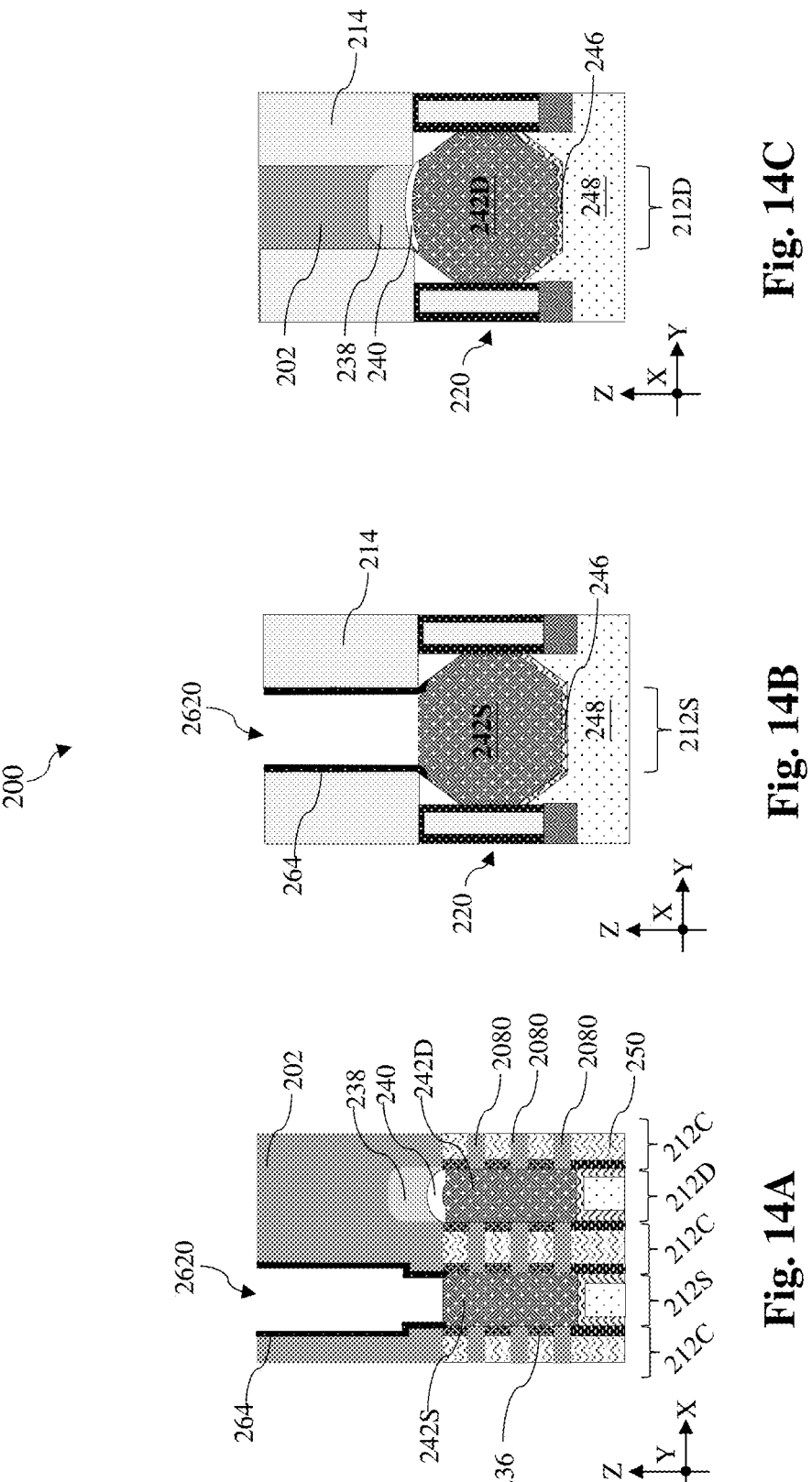

Reference is now made to FIGS. 14A, 14B and 14C. A dielectric barrier layer 264 is deposited over the workpiece 200 and is then etched back. In some embodiments, the dielectric barrier layer 264 may include silicon nitride. The dielectric barrier layer 264 is then etched back or pulled back, leaving the sidewalls of the second backside source contact opening 2620 covered by the dielectric barrier layer 264. As shown in FIGS. 14A, 14B and 14C, the etch back removes not only the dielectric barrier layer 264 on the first epitaxial layer 240 but also the first epitaxial layer 240, thereby exposing the source feature 242S. Here, the first epitaxial layer 240 serves as an epitaxial etch stop layer that prevents unintended damages to the source feature 242S. In some embodiments, the dielectric barrier layer 264 may be deposited using CVD, ALD, or a suitable process and the etch back may include use of an anisotropic etch process that may include use of nitrogen, hydrogen, a fluorine-containing gas (e.g., $NF_3$, $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof.

Referring to FIGS. 1, 15A, 15B, and 15C, method 100 includes a block 126 where a backside source contact 270 is formed. After the source feature 242S is exposed in the second backside source contact opening 2620, the backside source contact 270 is formed in the second backside source contact opening 2620. The backside source contact 270 may include a source silicide feature 266 and a source plug 268. To form the source silicide feature 266, a metal layer is deposited over the exposed surface of the source feature 242S and an anneal process is performed to bring about silicidation reaction between the metal layer and the source feature 242S. Suitable metal layer may include titanium (Ti), tantalum (Ta), nickel (Ni), cobalt (Co), or tungsten (W). The source silicide feature 266 may include titanium silicide (TiSi), titanium silicon nitride (TiSiN), tantalum silicide (TaSi), tungsten silicide (WSi), cobalt silicide (CoSi), or nickel silicide (NiSi). Although not explicitly shown, the excess metal layer that does not form the source silicide feature 266 may be removed. After the formation of the source silicide feature 266, a metal fill layer may be deposited into the second backside source contact opening 2620 to form the source plug 268. The metal fill layer may include tungsten (W), ruthenium (Ru), copper (Cu), cobalt (Co), titanium (Ti), titanium nitride (TiN), tantalum (Ta), titanium nitride (TaN), molybdenum (Mo), or nickel (Ni). A planarization process, such as a CMP process, may follow to remove excess materials and provide a planar top surface. The backside source contact 270 is electrically coupled to the source feature 242S.

Figures 15A, 15B, 15C:
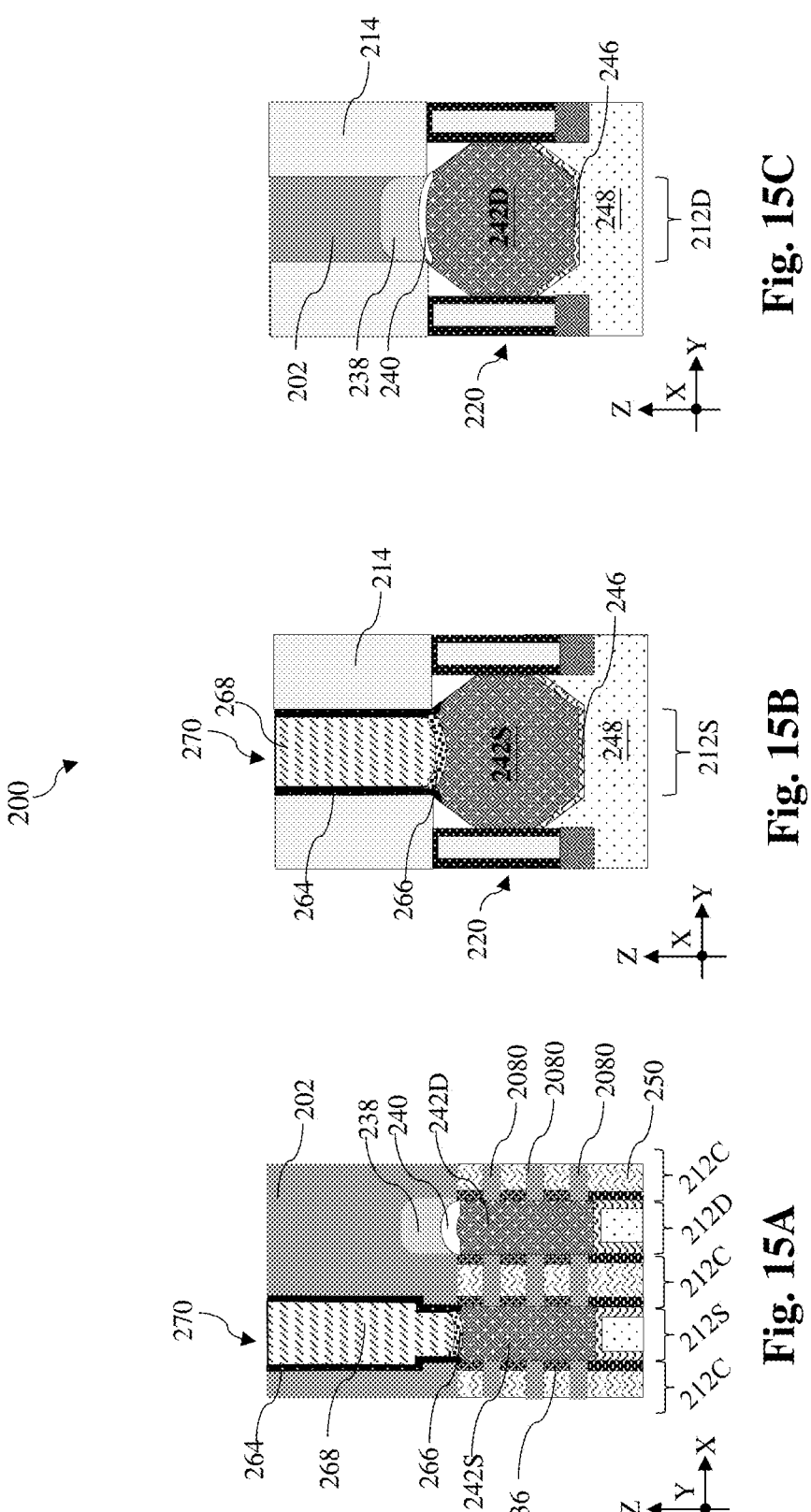
Figures 16A, 16B, 16C:
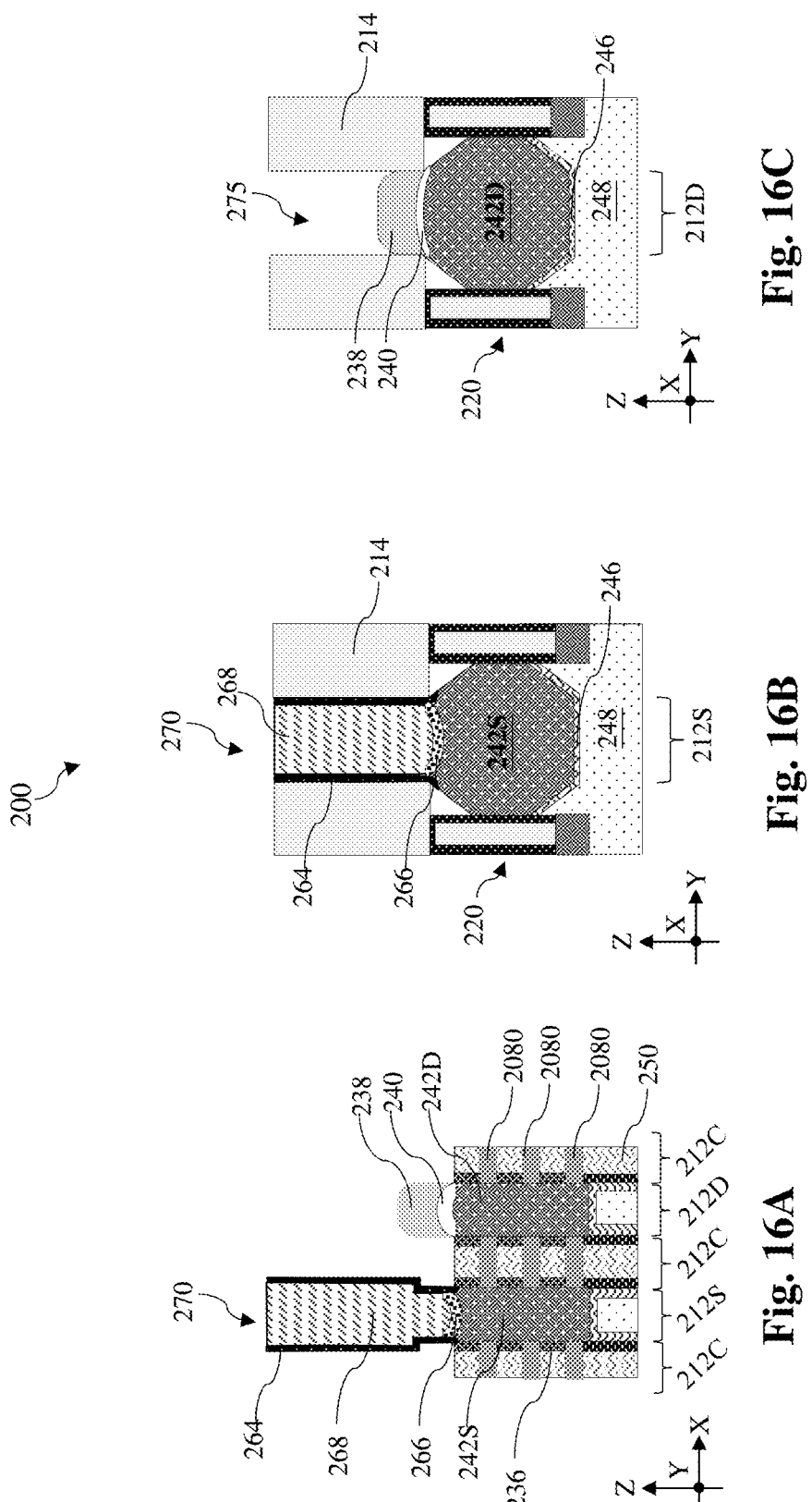
Figures 17A, 17B, 17C:
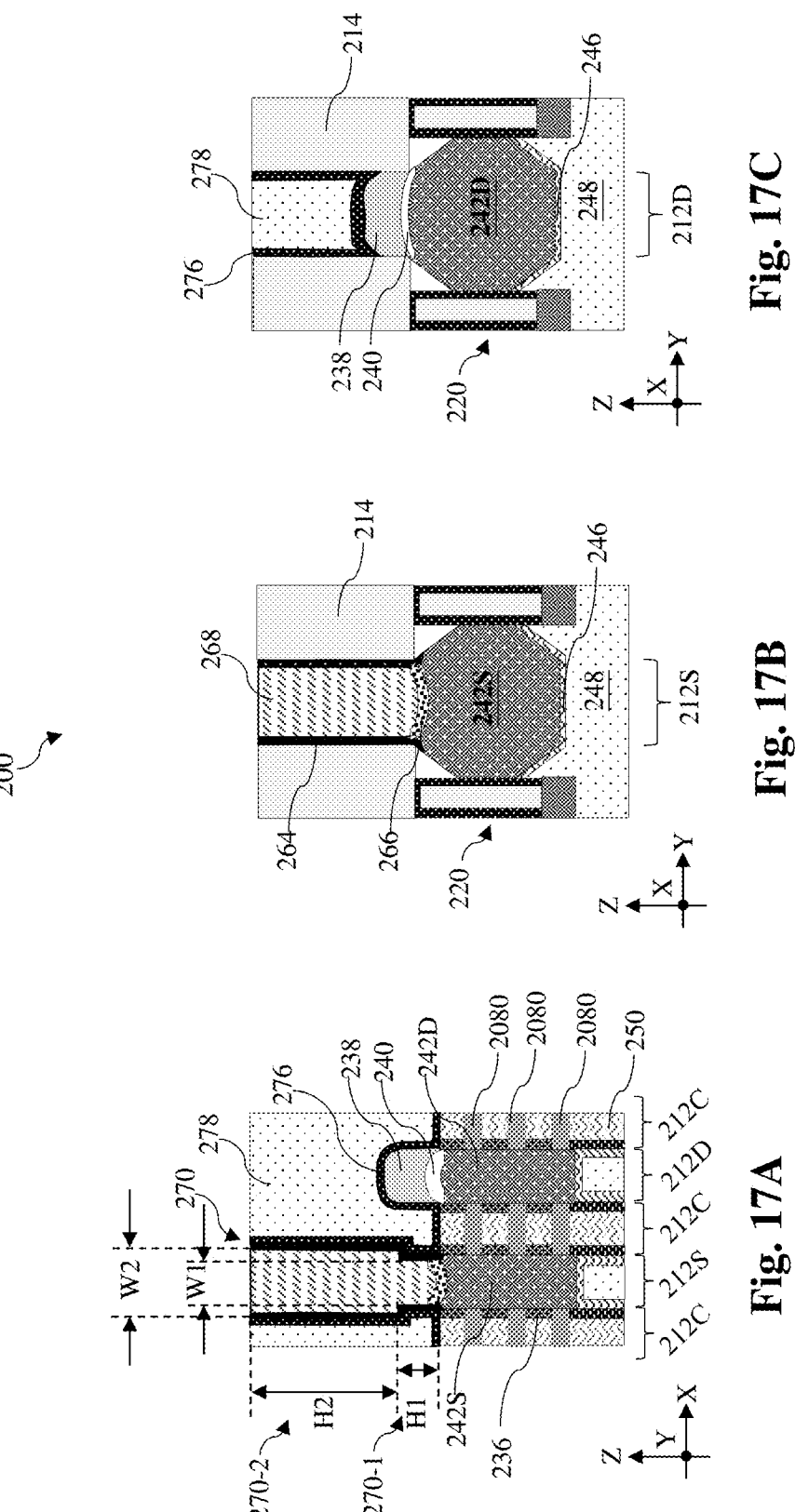

Referring to FIGS. 1, 16A, 16B, 16C, 17A, 17B, and 17C, method 100 includes a block 128 where the substrate 202 is replaced with a backside dielectric layer 278. As shown in FIGS. 15A, 15B and 15C, at conclusion of operations at block 126, the remaining substrate 202 is surrounded by features formed of different materials, including the isolation feature 214, the dielectric barrier layer 264, and the backside source contact 270. This arrangement allows the remaining substrate 202 to be selectively removed, as shown in FIGS. 16A, 16B and 16C. In some embodiments, the selective removal of the substrate 202 may carried out using selective wet etching or selective dry etching. Example selective wet etch processes may include a mixture of nitric acid and hydrofluoric acid or a solution of tetramethylammonium hydroxide (TMAH). Example selective dry etch processes may include a fluorine-containing gas (e.g., $NF_3$, $CF_4$, $SF_6$, $CH_2F_2$, $CHF_3$, and/or $C_2F_6$) and a chlorine-containing gas (e.g., $Cl_2$, $CHCl_3$, $CCl_4$, and/or $BCl_3$). Referring now to FIGS. 17A, 17B and 17C, after the remaining substrate 202 is selectively removed, a liner 276 is deposited over the back side of the workpiece 200 using CVD, ALD, or a suitable deposition technique. The liner 276 may include silicon nitride. Then a backside dielectric layer 278 is deposited over the liner 276. The backside dielectric layer 278 may include silicon oxide and may be deposited using spin-on coating, CVD, or plasma-enhanced CVD (PECVD). A planarization process, such as a CMP process, may be performed to remove excess materials.

In the depicted embodiment, the step-wise profile of the second backside source contact opening 2620 may result in a step-wise profile of the backside source contact 270. As shown in FIG. 17A, the backside source contact 270 includes a first portion 270-1 adjacent the source feature 242S and a second portion 270-2 away from the source feature 242S. The first portion 270-1 includes a first width W1 along the X direction and a first height H1 along the Z direction. The second portion 270-2 includes a second width W2 along the X direction and a second height H2 along the Z direction. In some embodiments, the second height H2 is equal to or greater than the first height and the first width W1 is different from the second width W2. In some implementations, a ratio of the second height H2 to the first height H1 is between about 1 and about 2. In these implementations, the first height H1 may be between about 1 nm and about 30 nm and the second height H2 may be between about 1 nm and about 30 nm. In some alternative embodiments, the first height H1 is smaller than the second height H2. In the depicted embodiments, there is a step-wise transition from the first width W1 to the second width W2. That is, the change from the first width W1 to the second width W2 is not gradual. This step-wise width change of the backside source contact 270 make it distinguishable from a contact having a tapered profile where the width change is gradual and continuous. In the embodiment illustrated in FIG. 17A, the second width W2 is greater than the first width W1. In some instances, a ratio of the second width W2 to the first width W1 is between about 1.1 and about 2.5. In these instances, the second width W2 may be between about 6 nm and about 20 nm and the first width W1 may be between about 5 nm and about 15 nm.

Referring to FIG. 1, method 100 includes a block 130 where further processes are performed. Such further processes may include, for example, formation of a backside power rail (not shown). In an example process, an insulation layer having a composition similar to the ILD layer 248 may be deposited over the back side of the workpiece 200, including over the backside dielectric layer 278, the isolation feature 214, and the backside source contact 270. Then, a power rail trench may be patterned in the insulation layer. A barrier layer and a metal fill material are then deposited into the power rail trench to form a backside power rail. In some embodiments, the barrier layer in the backside power rail may include titanium nitride, tantalum nitride, cobalt nitride, nickel nitride, or tungsten nitride and the metal fill material in the backside power rail may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials over the insulation layer.

Figures 18A, 18B, 18C:
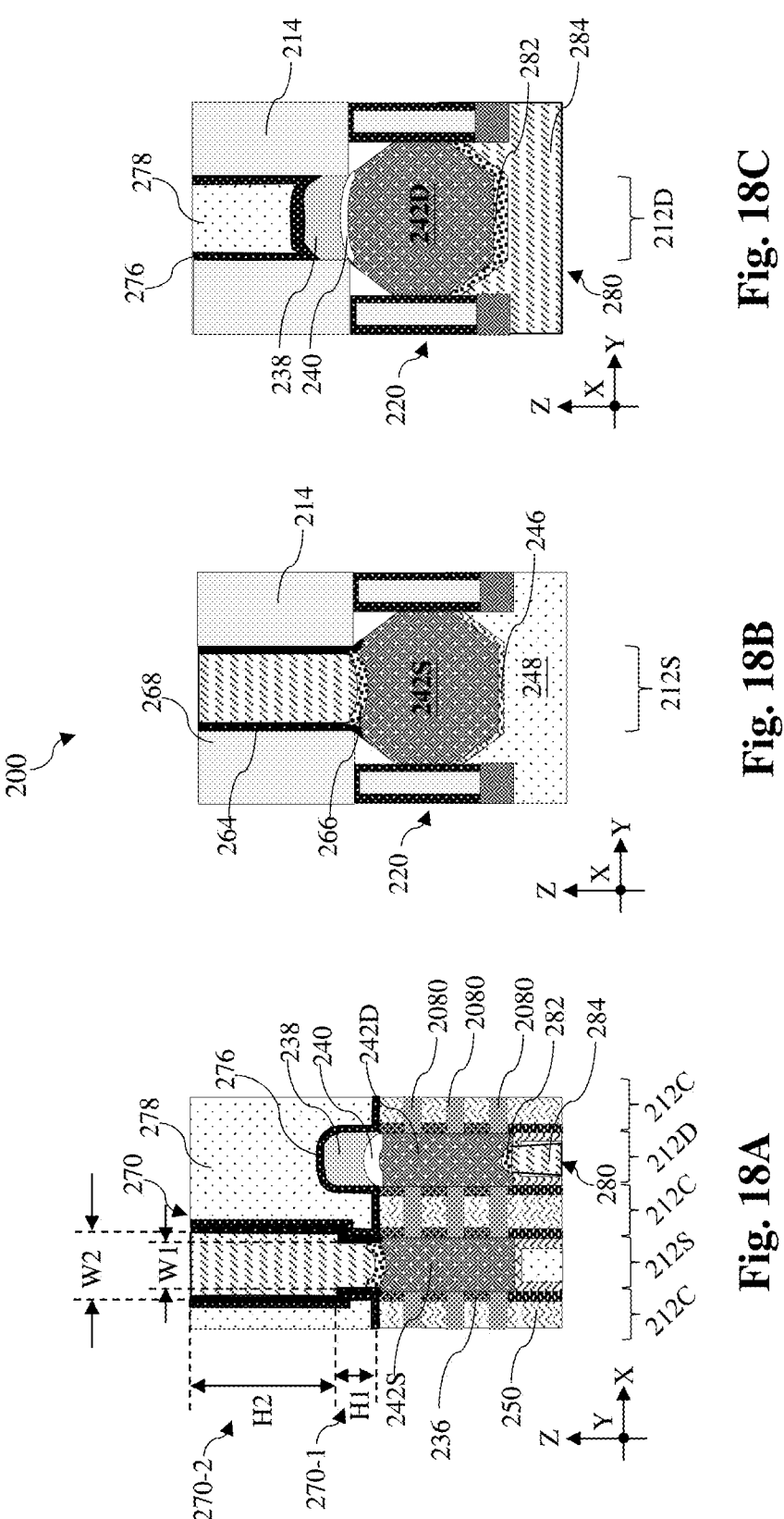
FIGS. 18A, 18B and 18C illustrate an alternative semiconductor structure fabricated using the method of FIG. 1, according to one or more aspects of the present disclosure.
Figure 19:
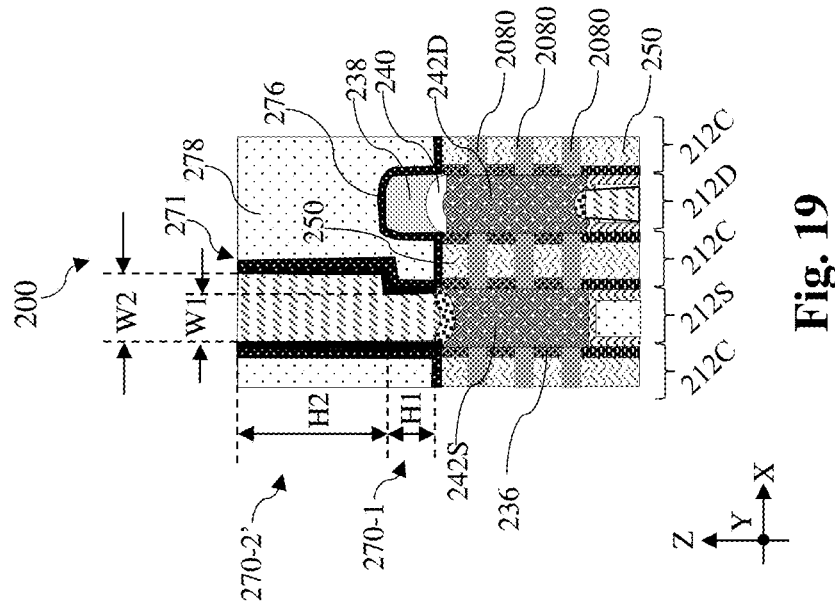
FIGS. 19 and 20 illustrate alternative semiconductor structures fabricated using the method of FIG. 1, according to one or more aspects of the present disclosure.

In embodiments shown in FIGS. 17A and 18A, the first portion 270-1 and the second portion 270-2 are aligned along the Z direction. That is, a center line of the first portion 270-1 coincides with a center line of the second portion 270-2. In some alternative embodiments illustrated in FIG. 19, an offset backside source contact 271 may be resulted from an imperfect mask overlay when the first backside source contact opening 262 is formed. The offset backside source contact 271 includes a first portion 270-1 and an offset second portion 270-2'. As shown in FIG. 19, the second portion 270-2' of the offset backside source contact 271 is not perfectly aligned with the first portion 270-1 along the Z direction. That is, a center line of the second portion 270-2' is offset from a center line of the first portion 270-1. The offsetting shown in FIG. 19 demonstrates advantages of the present disclosure. Even when the first backside source contact opening 262 is misaligned, it stops at around the level of the dummy epitaxial feature 238 and does not extend all the way to the gate structure 250. If the first backside source contact opening 262 is allowed to cut into the gate structure 250, the gate structure 250 will be shorted to the source feature 242S, rendering the MBC transistor defective.

Figure 20:
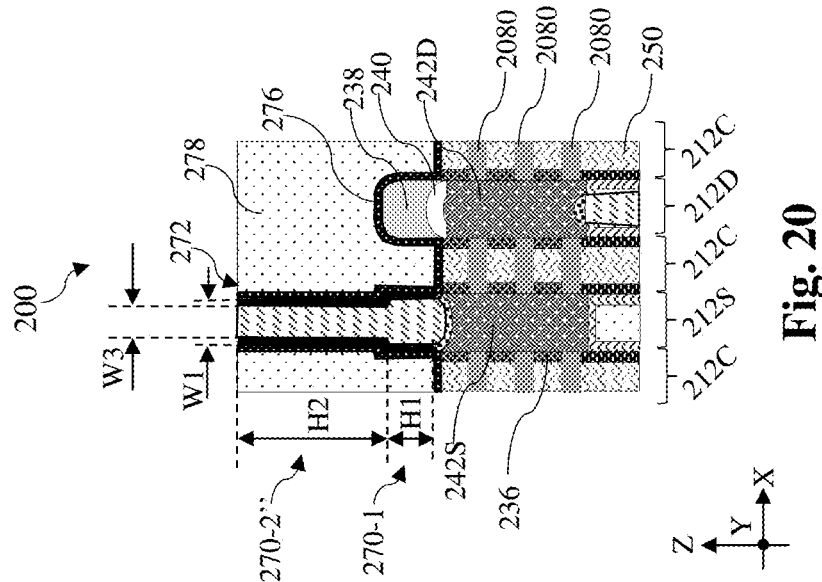

In embodiments shown in FIGS. 17A and 18A, the second width W2 is greater than the first width W1. The second portion 270-2 is wider than the first portion 270-1 along the X direction. In some alternative embodiments illustrated in FIG. 20, an alternative backside source contact 272 may be resulted when the first backside source contact opening 262 is narrower than the dummy epitaxial feature 238. As shown in FIG. 20, the alternative backside source contact 272 includes a first portion 270-1 and an alternative second portion 270-2". The alternative second portion 270-2" has a third width W3 that is smaller than the first width W1 of the first portion 270-1. In some instances, the third width W3 is between about 4 nm and about 13 nm.

In the workpiece 200 shown in FIGS. 17A, 18A, 19, 20, as no backside drain contacts are formed to couple to the drain feature 242D, the dummy epitaxial feature 238 and the first epitaxial layer 240 in the drain region 212D remain. As shown in FIGS. 17A, 18A, 19, 20, the first epitaxial layer 240 is in contact with the drain feature 242D and is disposed between the dummy epitaxial feature 238 and the drain feature 242D.

Embodiments of the present disclosure provide advantages. For example, methods of the present disclosure include forming a dummy epitaxial feature into a source opening that extends into a substrate. When forming a backside source contact opening, the substrate is first anisotropically etched to form a first backside source contact opening to expose the dummy epitaxial feature and then the dummy epitaxial feature is selectively and isotropically removed. As result of the two-step etch process, the resulted backside source contact includes a stepwise width change. In addition, the dummy epitaxial feature may remain in the drain region when no backside drain contact is formed. This two-step formation process of the backside source contact opening is advantageous in preventing shorts between the gate structure and the source feature.

In one exemplary aspect, the present disclosure is directed to a semiconductor structure. The semiconductor structure includes an epitaxial source feature and an epitaxial drain feature, a vertical stack of channel members disposed over a backside dielectric layer, the vertical stack of channel members extending between the epitaxial source feature and the epitaxial drain feature along a direction, a gate structure wrapping around each of the vertical stack of channel members, and a backside source contact disposed in the backside dielectric layer. The backside source contact includes a top portion adjacent the epitaxial source feature and a bottom portion away from the epitaxial source feature. The top portion and the bottom portion include a step width change along the direction.

In some embodiments, the semiconductor structure may further include a frontside drain contact over the epitaxial drain feature. In some implementations, a width of the top portion is greater than a width of the bottom portion along the direction. In some instances, a width of the top portion is smaller than a width of the bottom portion along the direction. In some embodiments, a center line of the bottom portion is offset from a center line of the top portion. In some instances, the semiconductor structure may further include a dummy epitaxial feature embedded in the backside dielectric layer. In some embodiments, the epitaxial drain feature includes a first epitaxial layer in contact with the dummy epitaxial feature and a second epitaxial layer over the first epitaxial layer. In some instances, the second epitaxial layer is in contact with the vertical stack of channel members and the first epitaxial layer is spaced apart from the vertical stack of channel members.

In another exemplary aspect, the present disclosure is directed to a semiconductor structure. The semiconductor structure includes a source feature and a drain feature, a plurality of channel members disposed over a backside dielectric layer and extending between the source feature and the drain feature along a first direction, the plurality of channel members being stacked along a second direction perpendicular to the first direction, a gate structure wrapping around each of the plurality of channel members, and a backside source contact disposed in the backside dielectric layer, the backside source contact including a first portion adjacent the source feature and a second portion away from the source feature. The first portion includes a first width along the first direction and the second portion includes a second width along the first direction. The first portion includes a first height along the second direction and the second portion includes a second height along the second direction. The first width is different from the second width and the first height is smaller than the second height.

In some embodiments, a ratio of the second height to the first height is between about 1.1 and about 2. In some embodiments, a center line of the second portion is offset from a center line of the first portion. In some implementations, the semiconductor structure may further include a dummy epitaxial feature embedded in the backside dielectric layer. In some implementations, the drain feature includes a first epitaxial layer in contact with the dummy epitaxial feature and a second epitaxial layer over the first epitaxial layer. In some instances, the first epitaxial layer and the second epitaxial layer include a dopant and a concentration of the dopant in the second epitaxial layer is greater than a concentration of the dopant in the first epitaxial layer. In some embodiments, the second epitaxial layer is in contact with the plurality of channel members and the first epitaxial layer is spaced apart from the plurality of channel members.

In yet another exemplary aspect, the present disclosure is directed to a method. The method includes forming, over a substrate, a stack including a plurality of channel layers interleaved by a plurality of sacrificial layers, patterning the stack and the substrate to form a fin-shaped structure, forming a source opening and a drain opening, depositing a dummy epitaxial feature in the source opening and the drain opening, forming a source feature in the source opening and a drain feature in the drain opening, the source feature and the drain feature being disposed over the dummy epitaxial feature, anisotropically etching the substrate to form a backside contact opening exposing the dummy epitaxial feature of the source feature, selectively and isotropically etching the dummy epitaxial feature, and forming a backside source contact in the backside contact opening to couple to the source feature. In some embodiments, the anisotropically etching includes use of hydrogen bromide, oxygen or chlorine. In some embodiments, the selectively and isotropically etching includes use of fluorine and hydrogen fluoride. In some instances, the method may further include before the forming of the source feature and the drain feature, depositing an epitaxial layer over the dummy epitaxial feature. In some embodiments, the method may further include before the forming of the backside source contact, depositing a dielectric barrier layer over the source opening and etching back the dielectric barrier layer. The etching back also removes the epitaxial layer over the source feature.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming, over a substrate, a stack including a plurality of channel layers interleaved by a plurality of sacrificial layers;
   patterning the stack and the substrate to form a fin-shaped structure;
   forming a source opening and a drain opening;
   depositing a dummy epitaxial feature in the source opening and the drain opening;
   forming a source feature in the source opening and a drain feature in the drain opening, the source feature and the drain feature being disposed over the dummy epitaxial feature;
   anisotropically etching the substrate to form a backside contact opening exposing the dummy epitaxial feature over the source feature;
   selectively and isotropically etching the dummy epitaxial feature; and
   forming a backside source contact in the backside contact opening to couple to the source feature.

2. The method of claim 1, wherein the anisotropically etching comprises use of hydrogen bromide, oxygen or chlorine.

3. The method of claim 1, wherein the selectively and isotropically etching comprises use of fluorine and hydrogen fluoride.

4. The method of claim 1, further comprising:
   before the forming of the source feature and the drain feature, depositing an epitaxial layer over the dummy epitaxial feature.

5. The method of claim 4, further comprising:

before the forming of the backside source contact, depositing a dielectric barrier layer over the source opening; and etching back the dielectric barrier layer, wherein the etching back also removes the epitaxial layer over the source feature.

6. A method, comprising:

forming, over a substrate, a stack including a plurality of channel layers interleaved by a plurality of sacrificial layers;

patterning the stack and the substrate to form a fin-shaped structure that includes a stack portion patterned from the stack and a base portion patterned from the substrate;

forming a source opening and a drain opening through the stack portion;

depositing a dummy epitaxial feature in the source opening and the drain opening;

forming a source feature in the source opening and a drain feature in the drain opening, the source feature and the drain feature being disposed over the dummy epitaxial feature;

anisotropically etching the substrate to form a backside contact opening exposing the dummy epitaxial feature over the source feature;

selectively and isotropically etching the dummy epitaxial feature; and forming a backside source contact in the backside contact opening to couple to the source feature, wherein a composition of the dummy epitaxial feature is different from a composition of the substrate.

7. The method of claim 6, wherein the dummy epitaxial feature comprises silicon germanium.

8. The method of claim 6, further comprising:

forming an isolation feature over the substrate to interface sidewalls of the base portion.

9. The method of claim 8, wherein the dummy epitaxial feature is deposited such that a top surface of the dummy epitaxial feature does not rise above a top surface of the isolation feature.

10. The method of claim 6, wherein the anisotropically etching comprises use of hydrogen bromide, oxygen or chlorine.

11. The method of claim 6, wherein the selectively and isotropically etching comprises use of fluorine and hydrogen fluoride.

12. The method of claim 6, further comprising:

before the forming of the backside source contact, depositing a dielectric barrier layer over the source opening; and etching back the dielectric barrier layer to expose the source feature in the backside contact opening.

13. The method of claim 12, wherein the dielectric barrier layer comprises silicon nitride.

14. The method of claim 6, wherein the forming of the backside source contact comprises:

forming a silicide feature over and interfacing the source feature; and depositing a metal fill layer over the silicide feature.

15. The method of claim 14, wherein the silicide feature comprises titanium silicide (TiSi), titanium silicon nitride (TiSiN), tantalum silicide (TaSi), tungsten silicide (WSi), cobalt silicide (CoSi), or nickel silicide (NiSi), wherein the metal fill layer comprises tungsten (W), ruthenium (Ru), copper (Cu), cobalt (Co), titanium (Ti), titanium nitride (TiN), tantalum (Ta), titanium nitride (TaN), molybdenum (Mo), or nickel (Ni).

16. A method, comprising:

forming, over a substrate, a stack including a plurality of channel layers interleaved by a plurality of sacrificial layers;

patterning the stack and the substrate to form a fin-shaped structure that includes a stack portion patterned from the stack and a base portion patterned from the substrate;

forming a source opening and a drain opening through the stack portion, the source opening and the drain opening partially extending into the base portion;

depositing a dummy epitaxial feature in the source opening and the drain opening;

forming a source feature in the source opening and a drain feature in the drain opening, the source feature and the drain feature being disposed over the dummy epitaxial feature;

forming a patterned hard mask over the substrate, the patterned hard mask comprising an opening vertically aligned with the source feature;

anisotropically etching the substrate using the patterned hard mask as an etch mask to form a backside contact opening exposing the dummy epitaxial feature over the source feature;

selectively and isotropically etching the dummy epitaxial feature; and forming a backside source contact in the backside contact opening to couple to the source feature.

17. The method of claim 16, wherein a composition of the dummy epitaxial feature is different from a composition of the substrate.

18. The method of claim 16, wherein the dummy epitaxial feature comprises silicon germanium.

19. The method of claim 16, further comprising:

forming an isolation feature over the substrate to interface sidewalls of the base portion, wherein the source feature and the drain feature.

20. The method of claim 16, further comprising:

before the forming of the backside source contact, depositing a dielectric barrier layer over the source opening; and etching back the dielectric barrier layer to expose the source feature in the backside contact opening.

\* \* \* \* \*